US006972237B2

(12) United States Patent
Verma et al.

(10) Patent No.: US 6,972,237 B2
(45) Date of Patent: Dec. 6, 2005

(54) LATERAL HETEROJUNCTION BIPOLAR TRANSISTOR AND METHOD OF MANUFACTURE USING SELECTIVE EPITAXIAL GROWTH

(75) Inventors: Purakh Raj Verma, Singapore (SG); Shao-fu Sanford Chu, Singapore (SG); Lap Chan, Singapore (SG); Jia Zhen Zheng, Singapore (SG); Jian Xun Li, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/725,670

(22) Filed: Dec. 1, 2003

(65) Prior Publication Data

US 2005/0116254 A1 Jun. 2, 2005

(51) Int. Cl.[7] ............... H01L 21/331; H01L 21/8222
(52) U.S. Cl. .............. 438/312; 438/235; 438/309; 438/316; 438/322; 438/325; 438/327; 257/183; 257/197; 257/198; 257/565
(58) Field of Search .................... 438/312–313, 438/172, 322, 191, 235, 309, 133, 314–316, 438/325, 327, 335; 257/90–94, 85, 183, 565

(56) References Cited

U.S. PATENT DOCUMENTS

| | | | | |
|---|---|---|---|---|
| 4,951,115 A | * | 8/1990 | Harame et al. | 257/191 |
| 4,997,776 A | * | 3/1991 | Harame et al. | 438/313 |
| 5,010,039 A | * | 4/1991 | Ku et al. | 438/702 |
| 5,064,772 A | * | 11/1991 | Jambotkar | 438/320 |
| 5,294,823 A | * | 3/1994 | Eklund et al. | 257/370 |
| 5,543,653 A | * | 8/1996 | Grubisich | 257/593 |
| 5,552,624 A | * | 9/1996 | Skotnicki et al. | 257/350 |
| 5,580,798 A | * | 12/1996 | Grubisich | 438/358 |
| 6,271,097 B1 | * | 8/2001 | Morris | 438/312 |
| 6,368,930 B1 | * | 4/2002 | Enquist | 438/320 |
| 6,384,469 B1 | * | 5/2002 | Chantre | 257/565 |
| 6,492,237 B2 | * | 12/2002 | Kalnitsky et al. | 438/309 |
| 6,541,346 B2 | * | 4/2003 | Malik | 438/316 |
| 6,696,342 B1 | * | 2/2004 | Darwish et al. | 438/309 |
| 2002/0100916 A1 | * | 8/2002 | Enquist | 257/183 |
| 2002/0190273 A1 | * | 12/2002 | Delage et al. | 257/197 |
| 2002/0197807 A1 | * | 12/2002 | Jagannathan et al. | 438/312 |
| 2003/0025125 A1 | * | 2/2003 | Menut et al. | 257/141 |
| 2003/0082882 A1 | * | 5/2003 | Babcock et al. | 438/309 |
| 2003/0155611 A1 | * | 8/2003 | Chantre et al. | 257/343 |
| 2003/0186500 A1 | * | 10/2003 | Marty et al. | 438/202 |
| 2004/0126978 A1 | * | 7/2004 | Kalnitsky et al. | 438/309 |

* cited by examiner

*Primary Examiner*—B. William Baumeister
*Assistant Examiner*—Granvill D. Lee, Jr.
(74) *Attorney, Agent, or Firm*—Mikio Ishimaru

(57) ABSTRACT

A method for manufacturing a heterojunction bipolar transistor is provided. An intrinsic collector structure is formed on a substrate. An extrinsic base structure partially overlaps the intrinsic collector structure. An intrinsic base structure is formed adjacent the intrinsic collector structure and under the extrinsic base structure. An emitter structure is formed adjacent the intrinsic base structure. An extrinsic collector structure is formed adjacent the intrinsic collector structure. A plurality of contacts is formed through an interlevel dielectric layer to the extrinsic collector structure, the extrinsic base structure, and the emitter structure.

32 Claims, 13 Drawing Sheets

LATERAL HETEROJUNCTION BIPOLAR TRANSISTOR AND METHOD OF MANUFACTURE USING SELECTIVE EPITAXIAL GROWTH

TECHNICAL FIELD

The present invention relates generally to semiconductor technology, and more particularly to heterojunction bipolar transistors and a method of manufacturing therefor using selective epitaxial growth.

BACKGROUND ART

A popular device for controllably varying the magnitude of electrical current flowing between two terminals is a bipolar junction transistor (BJT). BJTs have three terminals. The three terminals include a base terminal, a collector terminal, and an emitter terminal. The movement of electrical charge carriers, which produce electrical current flow between the collector and the emitter terminals, varies dependent upon variations in the voltage on the base terminal thereby causing the magnitude of the current to vary. Thus, the voltage across the base and emitter terminals controls the current flow through the emitter and collector terminals.

The terminals of a BJT are connected to their respective base, collector and emitter structures formed in a semiconductor substrate. BJTs comprise two p-n junctions placed back-to-back in close proximity to each other, with one of the regions common to both junctions. There is a first junction between the base and the emitter, and a second junction between the emitter and the collector. This forms either a p-n-p or an n-p-n transistor depending upon the characteristics of the semiconductive materials used to form the BJT.

Recently, demand for BJTs has increased significantly because these transistors are capable of operating at higher speeds and driving more current. These characteristics are important for high-speed, high-frequency communication networks such as those required by cell phones and computers.

BJTs can be used to provide linear voltage and current amplification because small variations of the voltage between the base and emitter terminals, and hence the base current, result in large variations of the current and voltage output at the collector terminal. The transistor can also be used as a switch in digital logic and power switching applications. Such BJTs find application in analog and digital circuits and integrated circuits at all frequencies from audio to radio frequency.

Heterojunction bipolar transistors (HBTs) are BJTs where the emitter-base junction is formed from two different semiconductive materials having similar characteristics. Materials used in forming the base-emitter junction are preferably compound semiconductive materials such as silicon-germanium (SiGe), silicon-germanium-carbon (SiGeC), or a combination thereof. HBTs using compound semiconductive materials have risen in popularity due to their high-speed and low electrical noise capabilities, coupled with the ability to manufacture them using processing capabilities used in the manufacture of silicon BJTs. Lateral HBTs are HBTs in which the current flow is parallel to the surface of the substrate on which the HBT is manufactured. HBTs have found use in higher-frequency applications such as cell phones, optical fiber, and other high-frequency applications requiring faster switching transistors, such as satellite communication devices.

Although the use of compound semiconductive materials has proven useful in HBTs, once formed by existing methods, this material is subsequently subjected to multiple thermal cycles, implantations and/or etching processes during the formation steps of the remaining elements of the HBT. Such steps include the deposition and etching of oxide layers, nitride layers and subsequently formed polysilicon layers. Several of these processing steps inherently damage the compound semiconductive material. Etching polysilicon over a compound semiconductive layer, for example, adversely affects the compound semiconductive material because the etchants used do not selectively etch only the polysilicon. Some of the compound semiconductive material is also etched during this processing step, resulting in HBTs that are slower and exhibit poor noise performance compared to other HBTs on the same semiconductor wafer. The adverse effects of etching the emitter window persist however. During the operation of etching the stack over-etching still occurs. The lack of adequate controls and reproducibility of over-etching typically results in the intrinsic base being implanted after formation of the emitter window. Implantation on the over-etched surface does not overcome the problems associated with the over-etched surface.

Furthermore, to improve the operating speed of a HBT, it is important that the base structure be thin enough to minimize the time it takes electronic charges to move from the emitter to the collector, thereby minimizing the response time of the HBT. It is also important, however, that the base structure have a high concentration of dopant in order to minimize base resistance. Typically, ion implantation techniques are used to form a base layer. However, this technique has the problem of ion channeling, which limits the minimum thickness of the base layer. Another disadvantage of ion implantation is that the compound semiconductive layer is often damaged by the ions during implantation.

Additionally, high-temperature annealing typically is required to drive dopants into the various material layers. This annealing step, however, alters the profile of concentration levels of the dopants within the various layers of semiconductive materials forming the transistor to create undesirable dopant profiles within the various material layers.

Existing methods of manufacturing HBTs still have the problems associated with over-etching, the detrimental effects of ion implantation and annealing, and consistency of manufacturability.

Additionally, existing HBTs require both shallow trench isolations STIs) and deep trench isolations (DTIs) for both transistor isolation and to reduce collector-substrate load capacitance as well as other parasitic capacitances in the transistor.

Furthermore, the differences in manufacturing techniques used to form complimentary metal oxide semiconductor (CMOS) transistors and HBTs have made it difficult to manufacture bipolar complimentary metal oxide semiconductor (BiCMOS) integrated circuits using compound semiconductive materials that have proven to be useful in HBTs.

Solutions to these problems have been long sought but prior developments have not taught or suggested any solutions and, thus, solutions to these problems have long eluded those skilled in the art.

DISCLOSURE OF THE INVENTION

The present invention provides a method for manufacturing a heterojunction bipolar transistor with a substrate. A collector structure is formed on the substrate, and an extrinsic base structure is formed over the collector structure. An intrinsic base structure is formed laterally adjacent the collector structure. An emitter structure is formed laterally adjacent the intrinsic base structure. An interlevel dielectric layer is formed and a number of contacts are formed through the interlevel dielectric layer to the collector structure, the base structure, and the emitter structure.

The present invention overcomes the problems associated with existing HBTs. In some embodiments, shallow trench isolations and deep trench isolations are unnecessary.

Parasitic capacitances are reduced. There is a high reduction in the collector-substrate capacitance thereby reducing the load capacitance at high frequencies. There is a significant reduction in the base-collector capacitance because there is no extrinsic base directly contacting the collector.

The present invention also can be utilized with existing bipolar complimentary metal oxide semiconductor (BiCMOS) processing techniques.

Certain embodiments of the invention have other advantages in addition to, or in place of, those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail.

Likewise, the drawings showing embodiments of the apparatus are semi-diagrammatic and not to scale and, particularly, some of the dimensions are for the clarity of presentation and are shown greatly exaggerated in the FIGs.

Generally, the device can be operated in any orientation.

The term "horizontal" as used herein is defined as a plane parallel to the conventional plane or surface of a semiconductor wafer or substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" or "processed" as used herein includes deposition of material or photoresist, patterning, exposure, development, etching, cleaning, and/or removal of the material or photoresist as required in forming a described structure.

Figure 1:
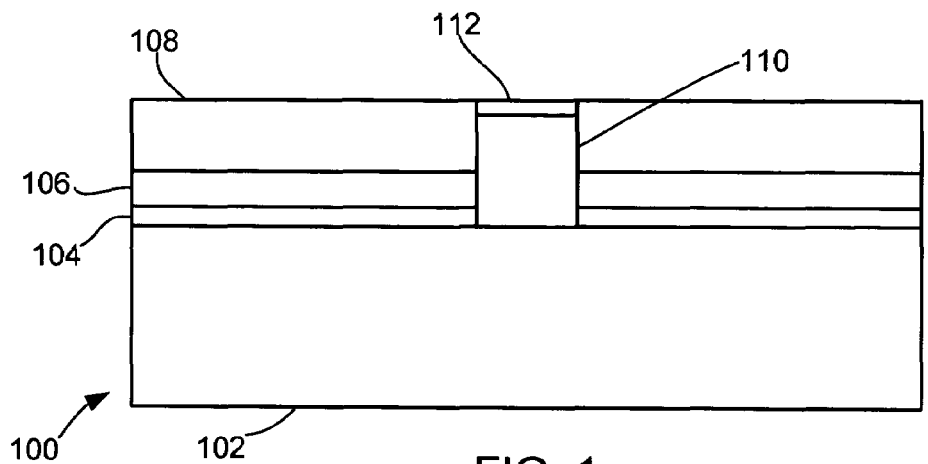
FIG. 1 is a partial cross-sectional view of a heterojunction bipolar transistor in an intermediate stage of manufacture in accordance with the present invention.

Referring now to FIG. 1, therein is shown a heterojunction bipolar transistor (HBT) 100 in an intermediate stage of manufacture in accordance with the present invention. The HBT 100 includes a semiconductor substrate 102, such as a lightly doped semiconductor of a first conductivity type, for example, a p$^-$ doped silicon substrate.

A first insulating layer 104, such as an oxide layer, is formed over the semiconductor substrate 102. A second insulating layer 106, such as a nitride layer, is formed over the first insulating layer 104. A third insulating layer 108, such as an oxide layer, is formed over the second insulating layer 106. The first insulating layer 104, the second insulating layer 106, and the third insulating layer 108 are processed to form a collector structure 110, such as lightly doped silicon such as an n$^-$ doped epitaxially grown silicon. A first insulating structure 112 is formed over the top of the collector structure 110.

Figure 2:
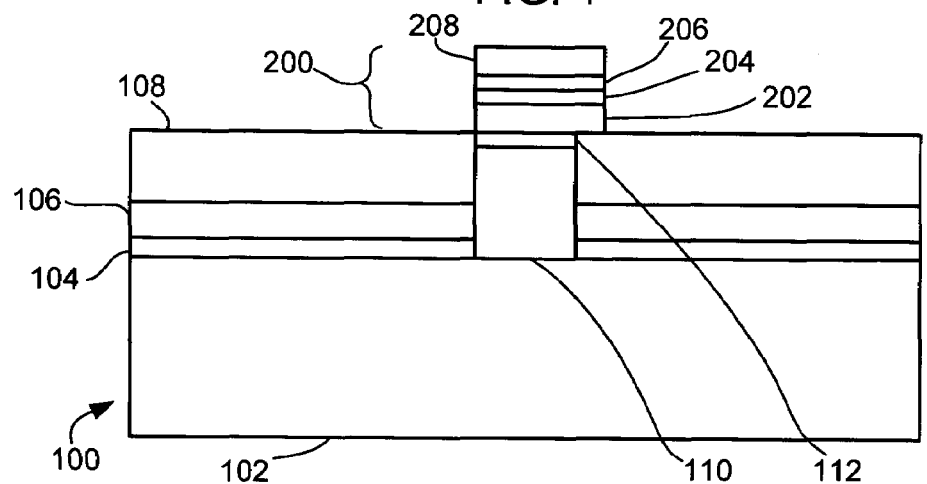
FIG. 2 is the structure of FIG. 1 after formation of an extrinsic base stack.

Referring now to FIG. 2, therein is shown the structure of FIG. 1 after formation of an extrinsic base stack 200. The extrinsic base stack 200 includes an extrinsic base structure 202 formed over the first insulating structure 112. A first silicide layer 204 is formed over the extrinsic base structure 202. A second insulating structure 206, such as a tetraethylorthosilicate (TEOS) structure, is formed over the first silicide layer 204. A third insulating structure 208, such as a nitride structure, is formed over the second insulating structure 206.

The extrinsic base stack 200 is formed by depositing the layers of the materials that make up the extrinsic base stack 200, and then masking, etching, and processing the layers to form the structures in the extrinsic base stack 200. Thus, the extrinsic base stack 200 is comprised of the extrinsic base structure 202, the first silicide structure 204, the second insulating structure 206, and the third insulating structure 208.

Figure 3:
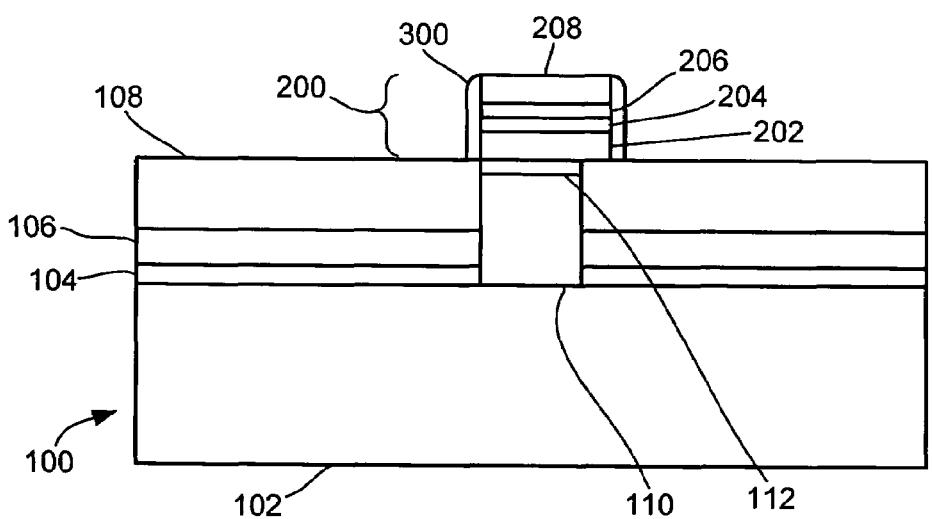
FIG. 3 is the structure of FIG. 2 after formation of an insulating spacer around the extrinsic base stack.

Referring now to FIG. 3, therein is shown the structure of FIG. 2 after formation of an insulating spacer 300, such as a nitride spacer around the extrinsic base stack 200. The insulating spacer 300 is formed by depositing an insulating material, such as a nitride layer, and processing the insulating layer using conventional semiconductor processing techniques.

Figure 4:
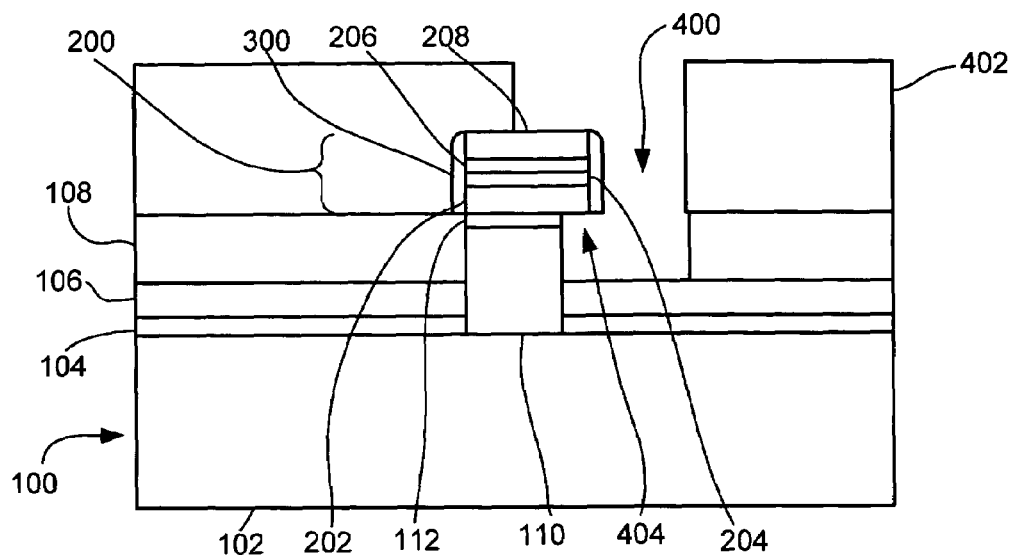
FIG. 4 is the structure of FIG. 3 after formation of an intrinsic base window.

Referring now to FIG. 4, therein is shown the structure of FIG. 3 after formation of an intrinsic base window 400. The intrinsic base window 400 is formed by providing a photoresist layer 402 that is then masked and processed. The intrinsic base window 400 is formed by performing a dry etch of the third insulating layer 108 and then performing a wet hydrofluoric acid/buffered oxide etch (HF/BOE) dip, which is an isotropic etch to form an undercut region 404 under a portion of the extrinsic base stack 200.

Figure 5:
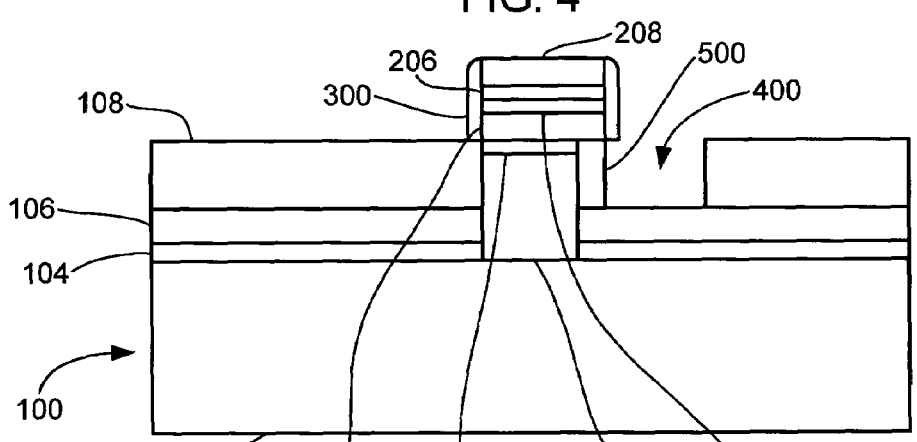
FIG. 5 is the structure of FIG. 4 after formation of an intrinsic base structure.

Referring now to FIG. 5, therein is shown the structure of FIG. 4 after formation of an intrinsic base structure 500. The photoresist layer 402 shown in FIG. 4 is stripped off. The intrinsic base structure 500 is formed by selectively growing a compound semiconductive material laterally on the collector structure 110. Preferably, the compound semiconductive material comprises at least one of silicon-germanium (Si/Ge), silicon-germanium-carbon (Si/Ge/C), and a combination thereof.

The intrinsic base structure 500 also preferably is heavily doped in situ to provide a heavily doped compound semiconductive material of the first conductivity type. The compound semiconductive material can be doped in situ, for example, by adding boron (B) to the compound semiconductive material as it is selectively formed on the lateral side of the collector structure 110 in the undercut region 404 beneath the extrinsic base stack 200.

Figure 6:
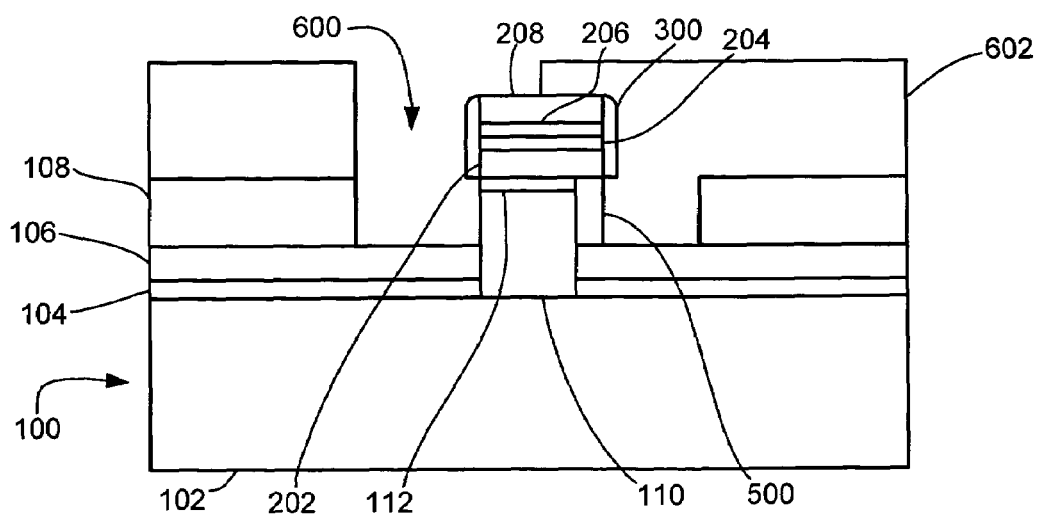
FIG. 6 is the structure of FIG. 5 after formation of an extrinsic collector window.

Referring now to FIG. 6, therein is shown the structure of FIG. 5 after formation of an extrinsic collector window 600. The extrinsic collector window 600 is formed by applying a photoresist layer 602. The photoresist layer 602 is then masked and processed to form the extrinsic collector window 600 on the side of the collector structure 110, opposite the side on which the intrinsic base structure 500 is formed.

Figure 7:
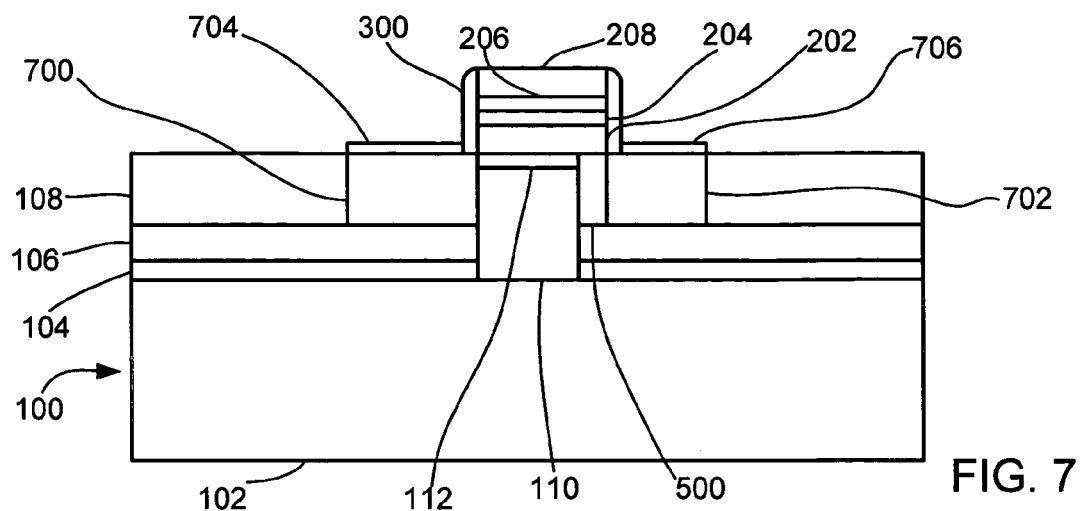
FIG. 7 is the structure of FIG. 6 after formation of an extrinsic collector structure and an emitter structure.

Referring now to FIG. 7, therein is shown the structure of FIG. 6 after formation of an extrinsic collector structure 700 and an emitter structure 702. The extrinsic collector structure 700 and the emitter structure 702 are formed by stripping the photoresist layer 602 shown in FIG. 6 and forming a doped polysilicon layer in the extrinsic collector window 600, and in the intrinsic base window 400 shown in FIG. 4 and FIG. 5. The polysilicon layer is doped in situ to create a polysilicon layer of the second conductivity type, such as an n$^+$-polysilicon layer. The polysilicon layer is then etched back so it is substantially level with the upper surface of the third insulating layer 108 thereby forming the extrinsic collector structure 700 and the emitter structure 702. If necessary, a rapid thermal anneal (RTA) can be performed to drive the dopant into the polysilicon layer.

Alternatively, the extrinsic collector structure 700 and the emitter structure 702 can be formed by selectively growing a doped polysilicon material of the second conductivity type, such as an n$^+$ doped polysilicon, in the extrinsic collector window 600 and in the intrinsic base window 400.

After the extrinsic collector structure 700 and the emitter structure 702 are formed, a second silicide structure 704 is formed over the extrinsic collector structure 700. A third silicide structure 706 is formed over the emitter structure 702. The second silicide structure 704 and the third silicide structure 706 are formed using conventional processing techniques known in the semiconductor manufacturing industry.

Figure 8:
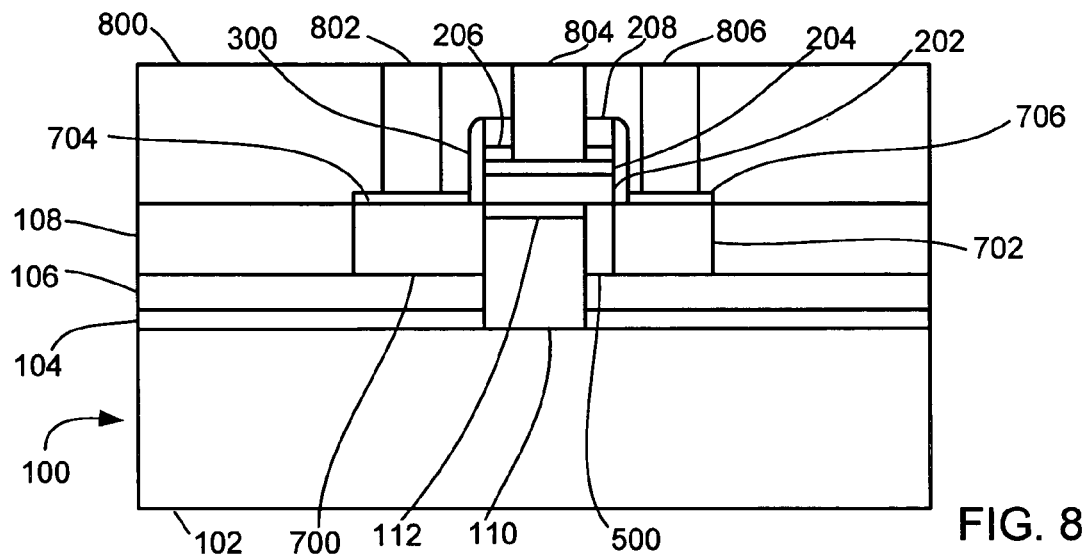
FIG. 8 is the structure of FIG. 7 after formation of a collector contact, a base contact, and an emitter contact in an interlevel dielectric layer.

Referring now to FIG. 8, therein is shown the structure of FIG. 7 after formation of a collector contact 802, a base contact 804, and an emitter contact 806 through an interlevel dielectric (ILD) layer 800. The ILD layer 800 is formed over the structure shown in FIG. 7 by depositing a dielectric material, such as an oxide, and then planarizing the dielectric material, such as by using a chemical mechanical polishing (CMP) process. A number of trenches are formed in the ILD layer 800. The trenches are filled with a suitable contact material such as tungsten (W) to form the collector contact 802, the base contact 804 and the emitter contact 806.

The collector contact 802 is formed through the ILD layer 800 in contact with the second silicide structure 704 over the extrinsic collector structure 700. The base contact 804 is formed through the ILD layer 800 in contact with the first silicide structure 204 over the extrinsic base structure 202.

The emitter contact 806 is formed through the ILD layer 800 in contact with the third silicide structure 706 over the emitter structure 702.

Figure 9:
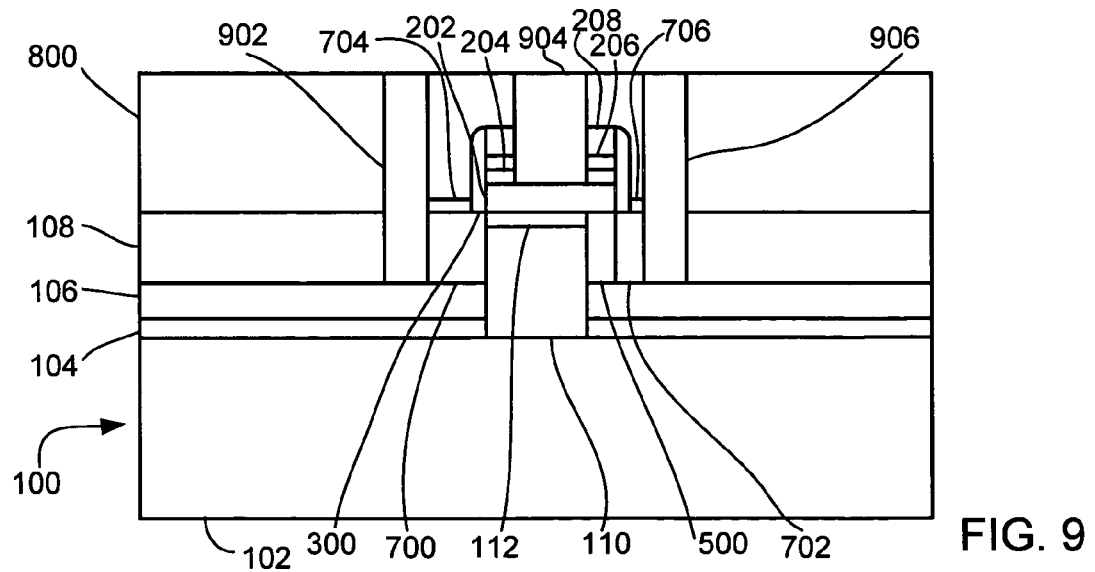
FIG. 9 is an alternate embodiment for formation of the collector contact, the base contact, and the emitter contact in the structure of FIG. 8.

Referring now to FIG. 9, therein is shown an alternate embodiment for formation of a collector contact 902, a base contact 904, and an emitter contact 906 in the structure of FIG. 8. The collector contact 902 is formed through the ILD layer 800 in contact with the outer side of the extrinsic collector structure 700. The base contact 904 is formed through the ILD layer 800, through the third insulating structure 208, through the second insulating structure 206, and in contact with the first silicide structure 204 above the extrinsic base structure 202. The emitter contact 906 is formed through the ILD layer 800 in contact with the outer side of the emitter structure 702.

Figure 10:
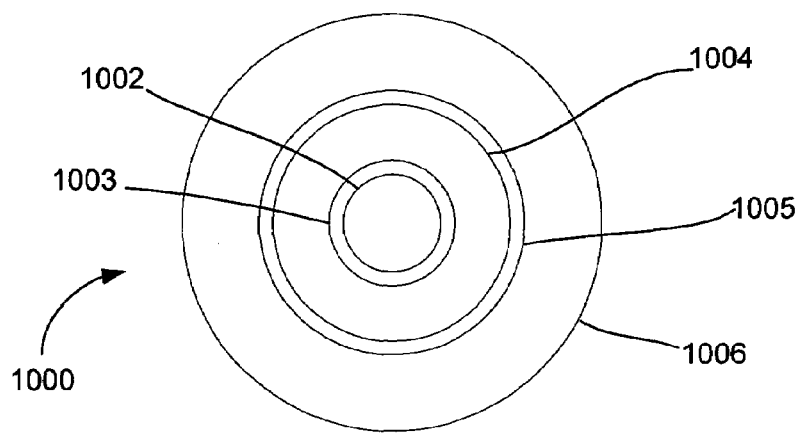
FIG. 10 is a plan view of a circular layout of a heterojunction bipolar transistor manufactured in accordance with the present invention.

Referring now to FIG. 10, therein is shown a plan view of a circular layout 1000 of the HBT 100 shown in FIGS. 1 through 9 in accordance with the present invention. The circular layout 1000 includes an emitter structure 1002 in the center of the circular layout 1000. An extrinsic base structure 1004 surrounds the emitter structure 1002 separated by a first insulating layer 1003. A collector structure 1006 surrounds the extrinsic base structure 1004 separated by a second insulating layer 1005. It will be readily apparent to those skilled in the art that the circular layout 1000 could also be oval.

Figure 11:
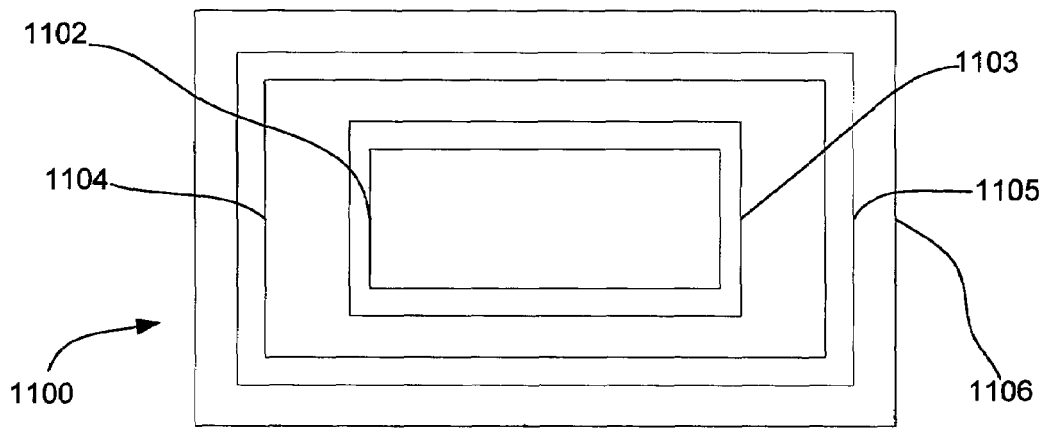
FIG. 11 is a plan view of a rectangular layout of a heterojunction bipolar transistor manufactured in accordance with the present invention.

Referring now to FIG. 11, therein is shown a plan view of a rectangular layout 1100 of the HBT 100 shown in FIGS. 1 through 9 manufactured in accordance with the present invention. The rectangular layout 1100 includes an emitter structure 1102 located in the center of the rectangular layout 1100. An extrinsic base structure 1104 surrounds the emitter structure 1102 separated by a first insulating layer 1103. A collector structure 1106 surrounds the extrinsic base structure 1104 separated by a second insulating layer 1105. It will be apparent to those skilled in the art that the rectangular layout 1100 could also be a square.

Figure 12:
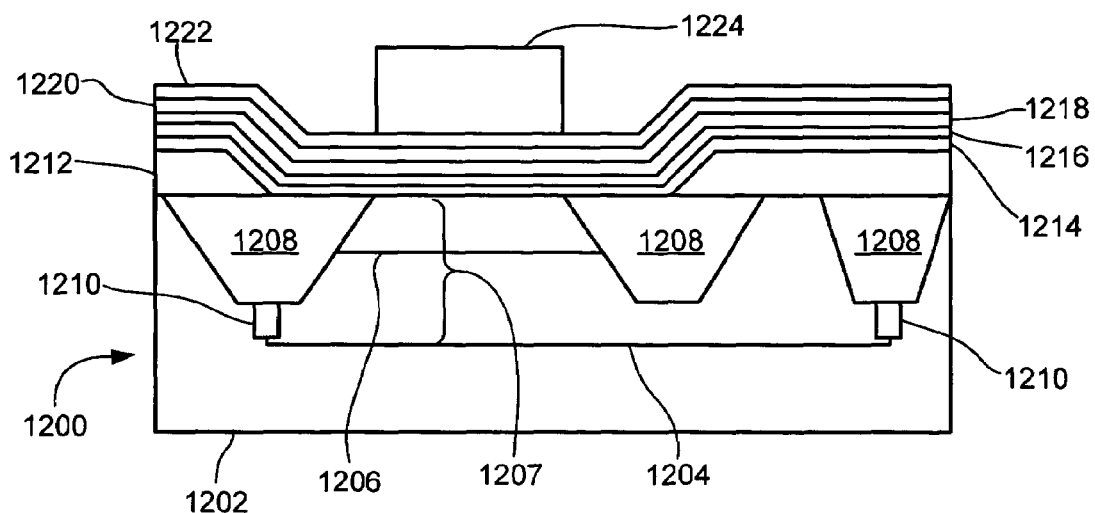
FIG. 12 is a partial cross-sectional view of a heterojunction bipolar transistor in an intermediate stage of manufacture in accordance with another embodiment of the present invention.

Referring now to FIG. 12, therein is shown a HBT 1200 in an intermediate stage of manufacture in accordance with an alternate embodiment of the present invention. The HBT 1200 includes a semiconductor substrate 1202 having an extrinsic collector structure 1204, such as a buried collector region therein. An intrinsic collector structure 1206, such as a sub-collector region, is located over the extrinsic collector structure 1204. Together the extrinsic collector structure 1204 and the intrinsic collector structure 1206 will be referred to as a collector structure 1207.

The semiconductor substrate also includes a number of shallow trench isolations (STIs) 1208. The STIs 1208 are formed by creating trenches in the semiconductor substrate 1202, and then filling the trenches with an insulating material, such as an oxide. The outermost STIs 1208 also have a number of deep trench isolations (DTIs) 1210 located beneath the number of STIs 1208.

Over the semiconductor substrate 1202 is a field-insulating layer 1212, such as a field oxide layer. A first insulating layer 1214, such as an oxide layer, is formed over the field-insulating layer 1212. A base polysilicon layer 1216, such as a heavily doped polysilicon layer of the first conductivity type, for example, a p+ doped polysilicon layer, is formed over the first insulating layer 1214. A second insulating layer 1218, such as an oxide layer, is formed over the base polysilicon layer 1216. An emitter polysilicon layer 1220, such as a heavily doped polysilicon layer of the second conductivity type, for example, an n+ doped polysilicon layer, is formed over the second insulating layer 1218. A third insulating layer 1222, such as an oxide layer is formed over the emitter polysilicon layer 1220. A photoresist layer 1224 is used to create a mask over the third insulating layer 1222. The photoresist layer 1224 is located over the intrinsic collector structure 1206.

Figure 13:
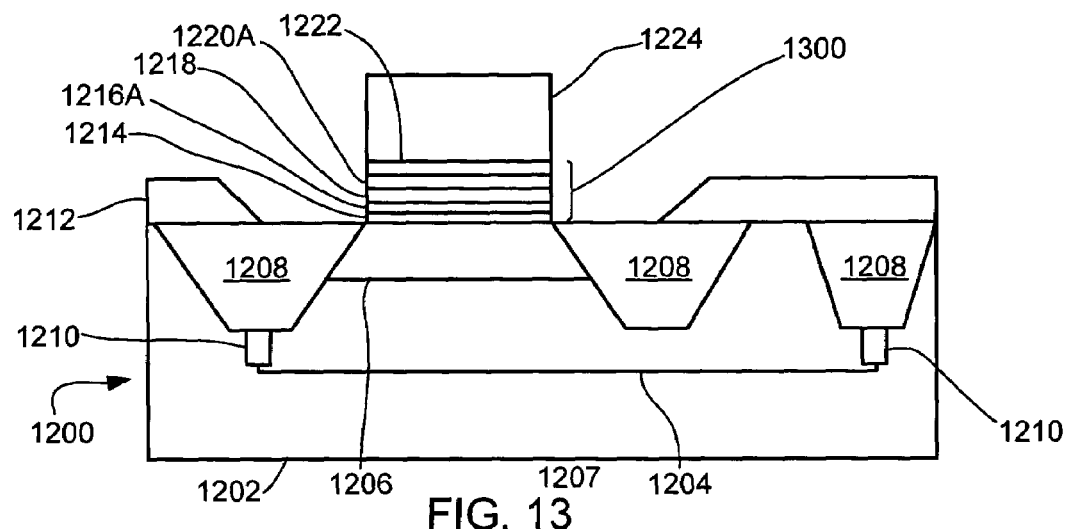
FIG. 13 is the structure of FIG. 12 after formation of an emitter-base stack.

Referring now to FIG. 13, therein is shown the structure of FIG. 12 after formation of an emitter-base stack 1300. The emitter-base stack 1300 is formed by using photolithographic techniques to remove, such as by etching, the third insulating layer 1222, the emitter polysilicon layer 1220, the second insulating layer 1218, the base polysilicon layer 1216, and the first insulating layer 1214 shown in FIG. 12 in the areas not covered by the photoresist layer 1224. There is thus formed an extrinsic emitter structure 1220A formed from the emitter polysilicon layer 1220 shown in FIG. 12, and an extrinsic base structure 1216A formed from the base polysilicon layer 1216 shown in FIG. 12 in the emitter-base stack 1300.

Figure 14:
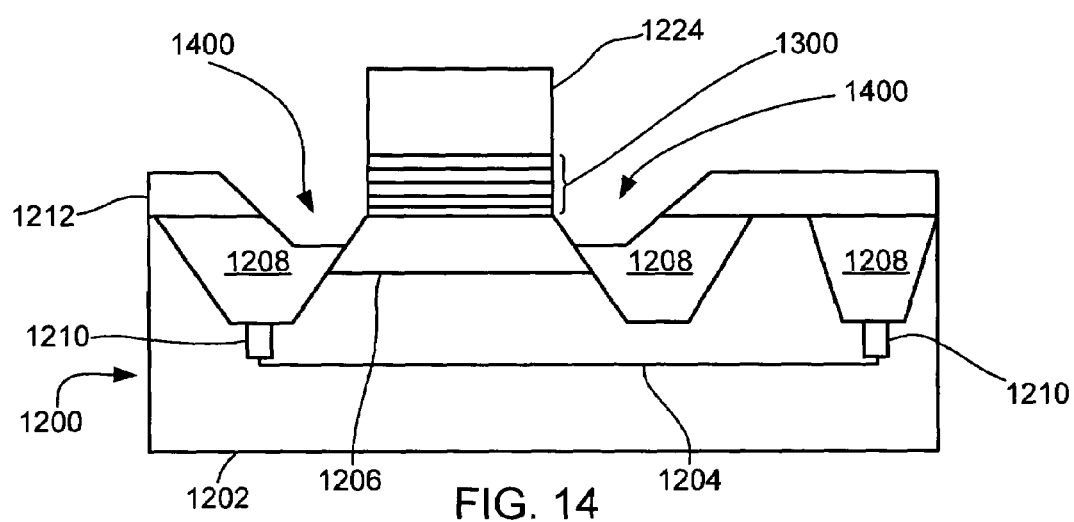
FIG. 14 is the structure of FIG. 13 after formation of a recess around the emitter-base stack.

Referring now to FIG. 14, therein is shown the structure of FIG. 13 after formation of a recess 1400 around the emitter-base stack 1300. The recess 1400 is formed by removing, such as by etching, a portion of the STIs 1208 on either side of the emitter-base stack 1300 to reveal an upper portion of the intrinsic collector structure 1206.

Figure 15:
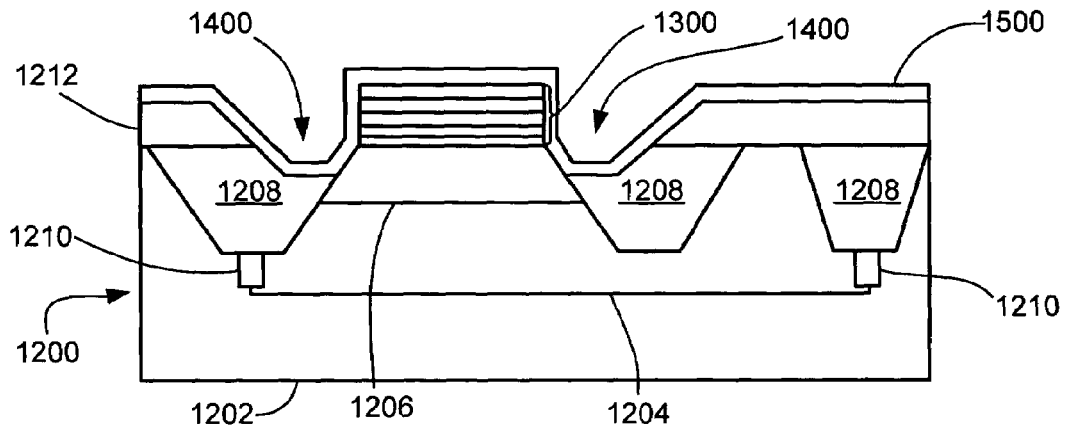
FIG. 15 is the structure of FIG. 14 after formation of an intrinsic base layer.

Referring now to FIG. 15, therein is shown the structure of FIG. 14 after formation of an intrinsic base layer 1500. The photoresist layer 1224 shown in FIG. 14 is removed. Then the intrinsic base layer 1500 is formed by depositing a thin, lightly doped compound semiconductive material of the first conductivity type, such as a p−-doped compound semiconductive material over the structure shown in FIG. 14. Preferably, the compound semiconductive material comprises silicon and at least one of silicon-germanium (Si/Ge), silicon-germanium-carbon (Si/Ge/C), and a combination thereof.

Figure 16:
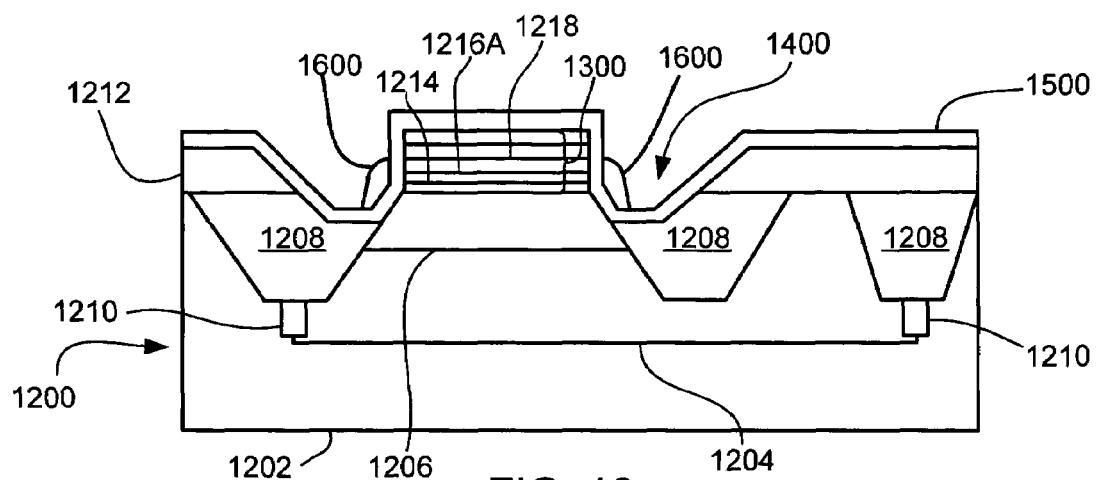
FIG. 16 is the structure of FIG. 15 after formation of an insulating spacer over the intrinsic base layer.

Referring now to FIG. 16, therein is shown the structure of FIG. 15 after formation of an insulating spacer 1600 over the intrinsic base layer 1500. The insulating spacer 1600 is formed by depositing an insulating material, such as a nitride, over the structure shown in FIG. 15 and processing the insulating material to form the insulating spacer 1600. The insulating spacer 1600 covers a portion of the intrinsic base layer 1500 and surrounds a lower portion of the emitter-base stack 1300 formed by the recess 1400. The insulating spacer 1600 extends up the sides of the emitter-base stack 1300 to cover the first insulating layer 1214, the extrinsic base structure 1216A, and the second insulating layer 1218 of the emitter-base stack 1300.

Figure 17:
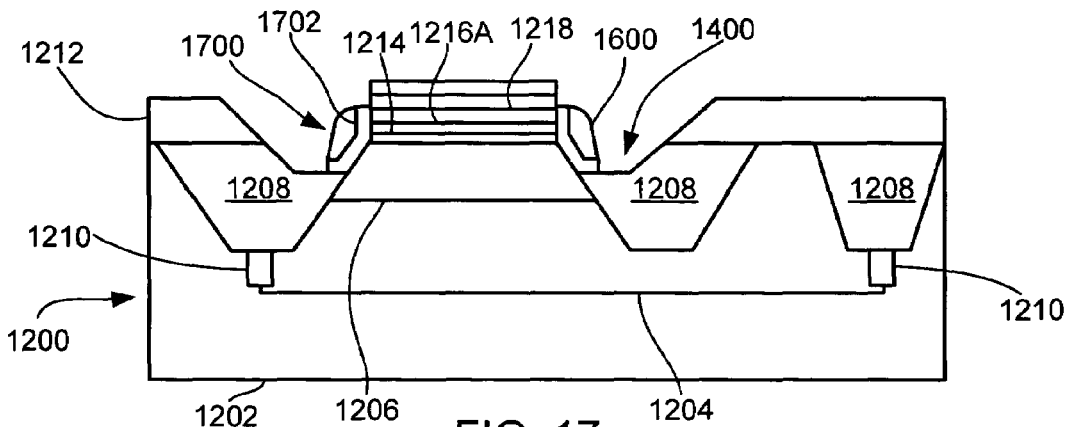
FIG. 17 is the structure of FIG. 16 after formation of a bi-layer spacer.

Referring now to FIG. 17, therein is shown the structure of FIG. 16 after processing the intrinsic base layer 1500 to form a bi-layer spacer 1700. The intrinsic base layer 1500 is removed, such as by etching, except in the area under the insulating spacer 1600 so an unetched portion 1702 of the intrinsic base layer 1500 remains. Thus, the bi-layer spacer 1700 comprising the unetched portion 1702 of the intrinsic base layer 1500 and the insulating spacer 1600 is formed.

Figure 18:
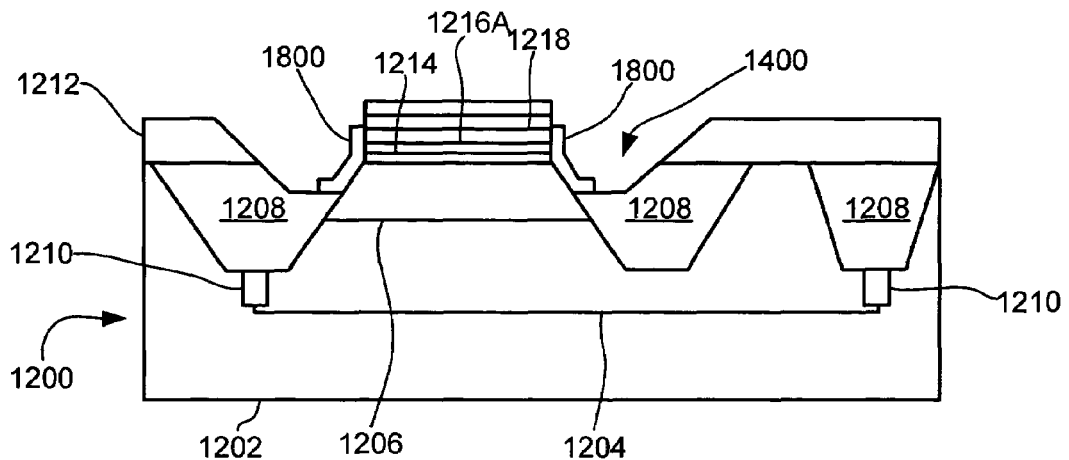
FIG. 18 is the structure of FIG. 17 after of an intrinsic base structure.

Referring now to FIG. 18, therein is shown the structure of FIG. 17 after formation of an intrinsic base structure 1800. The intrinsic base structure 1800 is formed by removing the insulating spacer 1600 thereby uncovering the unetched portion of the intrinsic base layer 1500. The intrinsic base structure 1800 is formed around the emitter-base stack 1300. The intrinsic base structure 1800 is in contact with the extrinsic base structure 1216A.

Figure 19:
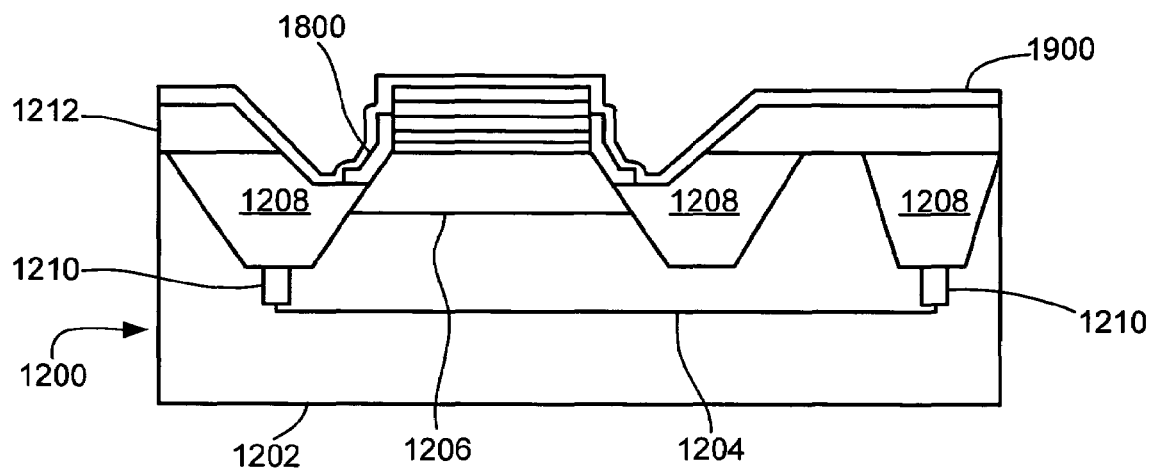
FIG. 19 is the structure of FIG. 18 after formation of an emitter layer.

Referring now to FIG. 19, therein is shown the structure of FIG. 18 after formation of an emitter layer 1900. The emitter layer 1900 is formed by depositing a semiconductive layer, such as a heavily doped polysilicon layer of the second conductivity type, for example, an n⁺ polysilicon layer over the structure shown in FIG. 18.

Figure 20:
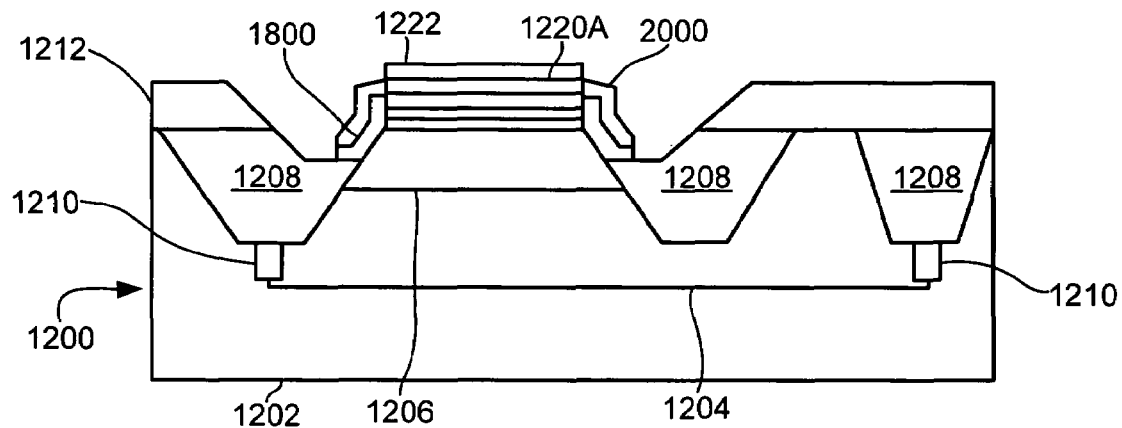
FIG. 20 is the structure of FIG. 19 after formation of an emitter structure.

Referring now to FIG. 20, therein is shown the structure of FIG. 19 after formation of an emitter structure 2000. The emitter structure 2000 is formed by masking, etching and processing the emitter layer 1900 to form the emitter structure 2000 over the intrinsic base structure 1800. The upper portion of the emitter structure 2000 is in contact with the extrinsic emitter structure 1220A in the emitter-base stack 1300.

Figure 21:
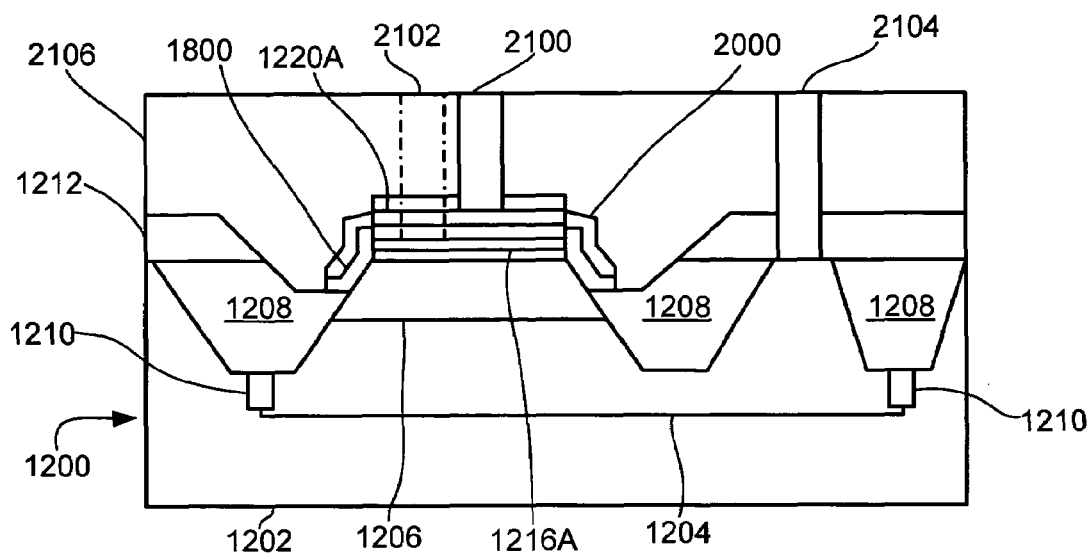
FIG. 21 is the structure of FIG. 20 after formation of an emitter contact, a base contact, and a collector contact in an interlevel dielectric layer.

Referring now to FIG. 21, therein is shown the structure of FIG. 20 after formation of an emitter contact 2100, a base contact 2102, and a collector contact 2104 in an interlevel dielectric (ILD) layer 2106. The ILD layer 2106 is formed over the structure shown in FIG. 20 by depositing a dielectric material, such as an oxide, and then planarizing the dielectric material, such as by using a chemical mechanical polishing (CMP) process. A number of trenches are formed in the ILD layer 2106. The trenches are filled with a suitable contact material such as tungsten (W) to form the emitter contact 2100, the base contact 2102, and the collector contact 2104.

The emitter contact 2100 is formed through the ILD layer 2106 in contact with the extrinsic emitter structure 1220A. The base contact 2102 is formed through the ILD layer 2106 in contact with the extrinsic base structure 1216A. The collector contact 2104 is formed through the ILD layer 2106 in contact with the extrinsic collector structure 1206.

The base contact 2102 is shown in phantom in FIG. 21 as being offset from the emitter contact 2100 for clarity of presentation. It will be appreciated by those skilled in the art that the base contact 2102 is actually substantially in line with the emitter contact 2100 as described in connection with FIG. 22A and FIG. 22B described below.

Figure 22A:
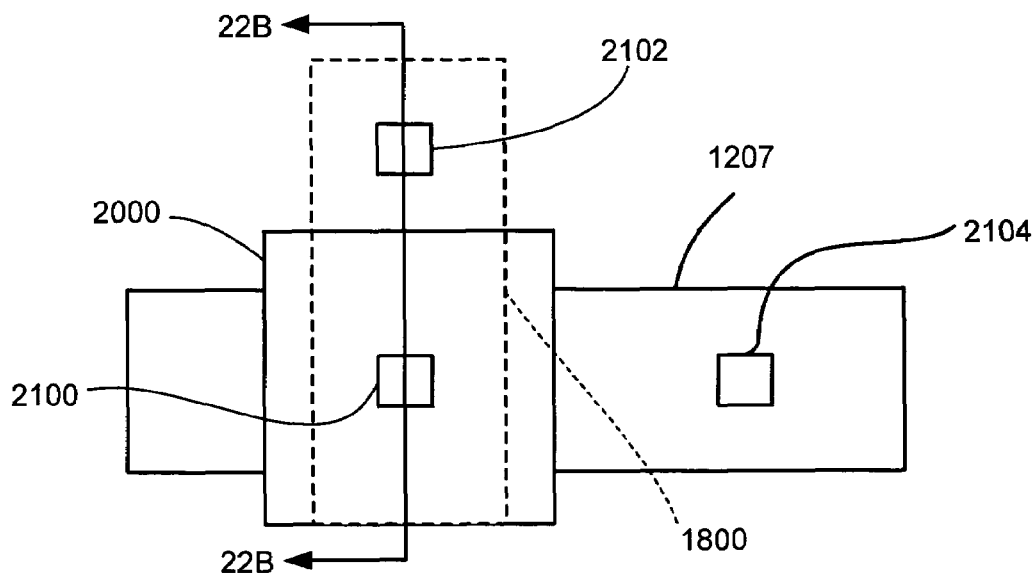
FIG. 22A is a plan view of the emitter structure, the intrinsic base structure, and the collector region of FIG. 20.

Referring now to FIG. 22A, therein is shown a plan view of the emitter structure 2000, the intrinsic base structure 1800, and the collector structure 1207 of FIG. 21. The emitter structure 2000 covers the intrinsic base structure 1800. The collector structure 1207 is substantially perpendicular to the emitter structure 2000 and the intrinsic base structure 1800.

Figure 22B:
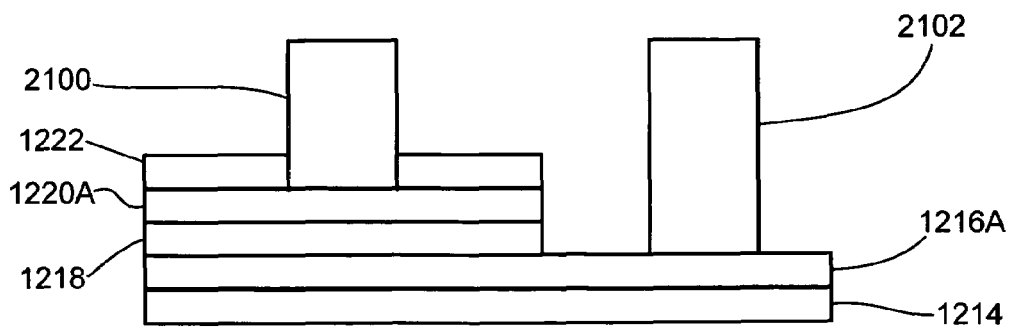
FIG. 22B is a cross sectional view taken along line 22B—22B of FIG. 21.

Referring now to FIG. 22B therein is shown a cross sectional view taken along line 22B—22B of FIG. 21. The emitter contact 2100 is formed by etching the third insulating layer 1222 to stop on the extrinsic emitter structure 1220A. The base contact is formed by etching the third insulating layer 1222, the extrinsic emitter structure 1220A and the second insulating layer 1218 to stop on the extrinsic base structure 1216A.

Figure 23:
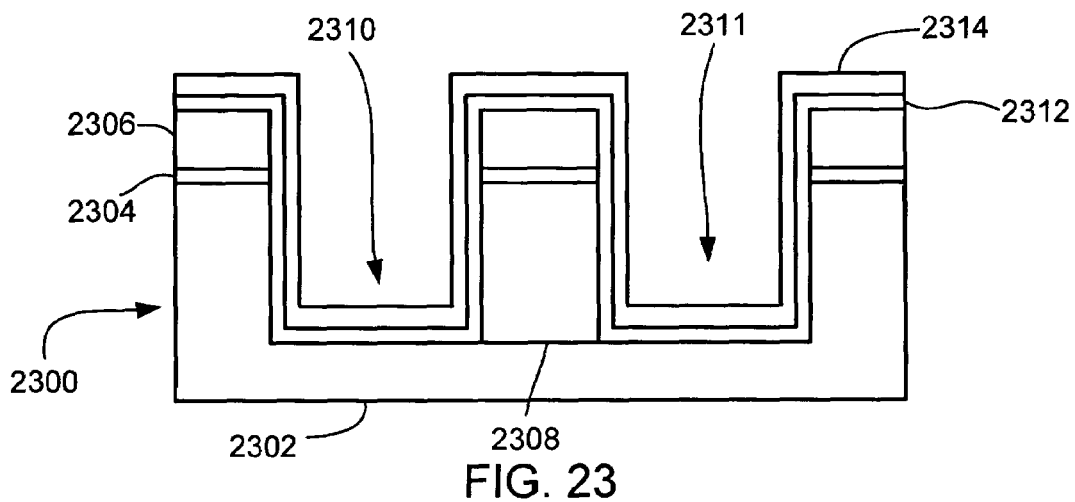
FIG. 23 is a partial cross-sectional view of a heterojunction bipolar transistor in an intermediate stage of manufacture in accordance with further embodiment of the present invention.

Referring now to FIG. 23, therein is shown a HBT 2300 in an intermediate stage of manufacture in accordance with a further embodiment of the present invention. The HBT 2300 includes a semiconductor substrate 2302, such as a lightly doped semiconductor substrate of the first conductivity type, for example, a p⁻ doped semiconductor substrate. A first insulating layer 2304, such as an oxide layer, is formed over the semiconductor substrate 2302. A second insulating layer 2306, such as a nitride layer, is formed over the first insulating layer 2304. The first insulating layer 2304 and the second insulating layer 2306 are then processed using a collector well mask to expose a portion of the semiconductor substrate 2302. The semiconductor substrate 2302 is then etched to form a first trench 2310 and a second trench 2311 on either side of an extrinsic collector structure 2308. The intrinsic collector structure 2308 is the second conductivity type, which is formed, for example, by implanting a dopant in the intrinsic collector structure 2308. The dopant then is driven into the intrinsic collector structure 2308. A third insulating layer 2312, such as a thin TEOS layer, is formed in the first trench 2310 and the second trench 2311. A fourth insulating layer 2314, such as a nitride layer, is formed over the third insulating layer 2312.

Figure 24:
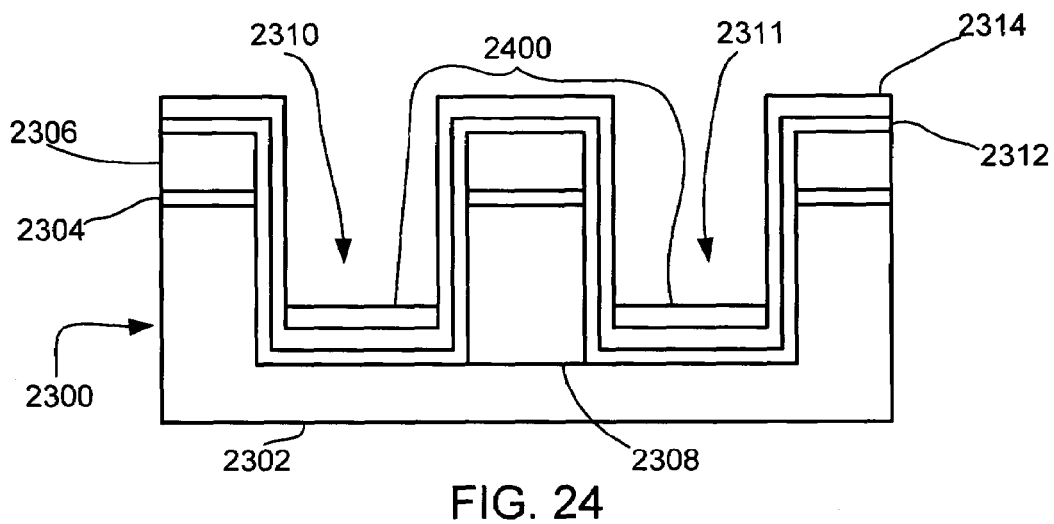
FIG. 24 is the structure of FIG. 23 after formation of an insulating layer.

Referring now to FIG. 24, therein is shown the structure of FIG. 23 after formation of a fifth insulating layer 2400, such as a TEOS layer. The fifth insulating layer 2400 is formed by filling the first trench 2310 and the second trench 2311 with a high-density plasma (HDP) oxide or TEOS layer. The fifth insulating layer 2400 then undergoes a chemical-mechanical polish (CMP) and then is recessed deep into the first trench 2310 and the second trench 2311 by etching.

Figure 25:
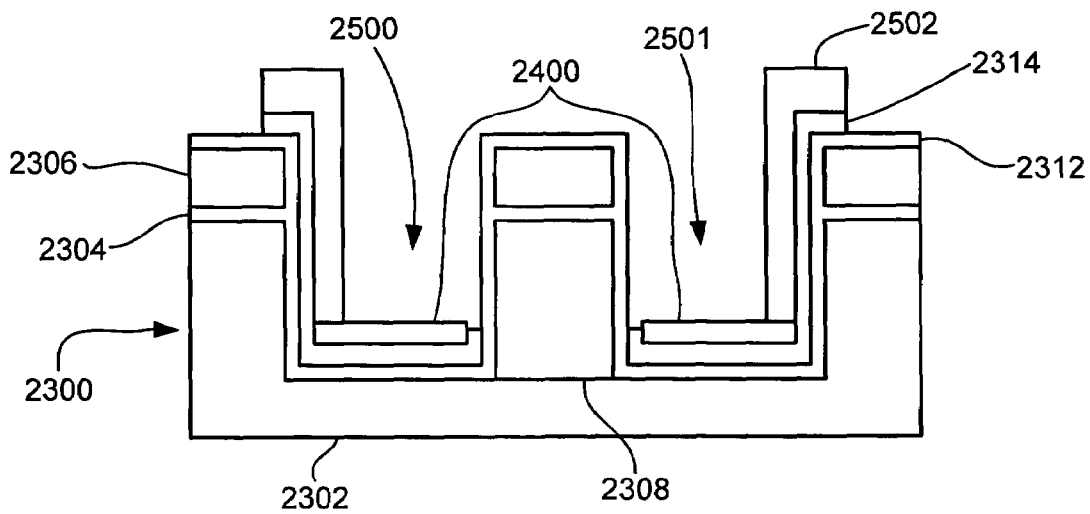
FIG. 25 is the structure of FIG. 24 after formation of a collector window and an emitter window.

Referring now to FIG. 25, therein is shown the structure of FIG. 24 after formation of a collector window 2500 and an emitter window 2501. The collector window 2500 and the emitter window 2501 are formed by providing a photoresist layer 2502 over a portion of the fourth insulating layer 2314. The photoresist layer 2502 is masked and processed to form the collector window 2500 and the emitter window 2501. The fourth insulating layer 2314 is removed, such as by etching, in the area of the fourth insulating layer 2314 unmasked by the photoresist layer 2502. Preferably, the processing includes an anisotropic etch and then an isotropic etch to define the collector window 2500 and the emitter window 2501.

Figure 26:
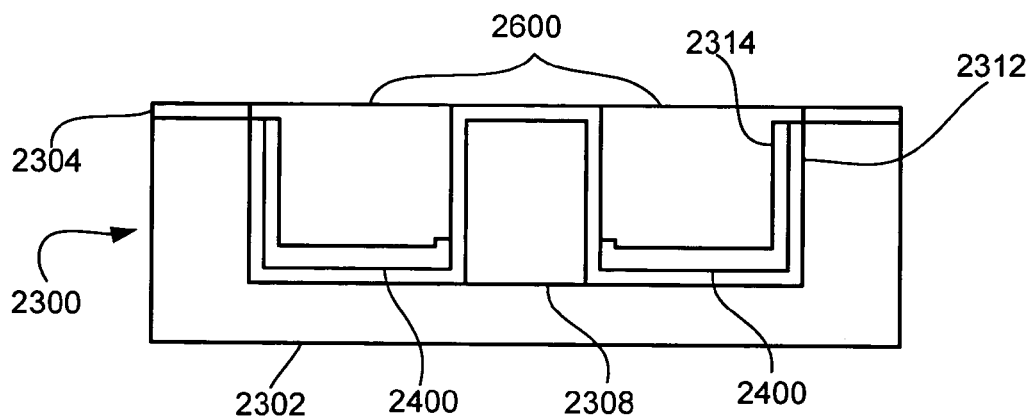
FIG. 26 is the structure of FIG. 25 after formation of an insulating material in the collector window and the emitter window.

Referring now to FIG. 26, therein is shown the structure of FIG. 25 after filling of the collector window 2500 and the emitter window 2501 with an insulating material 2600, such as the HDP oxide or the TEOS. The photoresist layer 2502 as shown in FIG. 25 is stripped. The collector window 2500 and the emitter window 2501 shown in FIG. 25 are filled with the insulating material 2600. The insulating material 2600 then undergoes a CMP process and the second insulating layer 2306 and the third insulating layer 2312 are removed, such as by etching.

It will be appreciated by one who is skilled in the art that the processing steps shown and described in FIGS. 23 through 26 can be performed at the very beginning of the manufacturing line. The remainder of the HBT 2300 then can be formed as part of a complementary metal oxide semiconductor (CMOS) process or a bipolar complimentary metal oxide semiconductor (BiCMOS) process.

Figure 27:
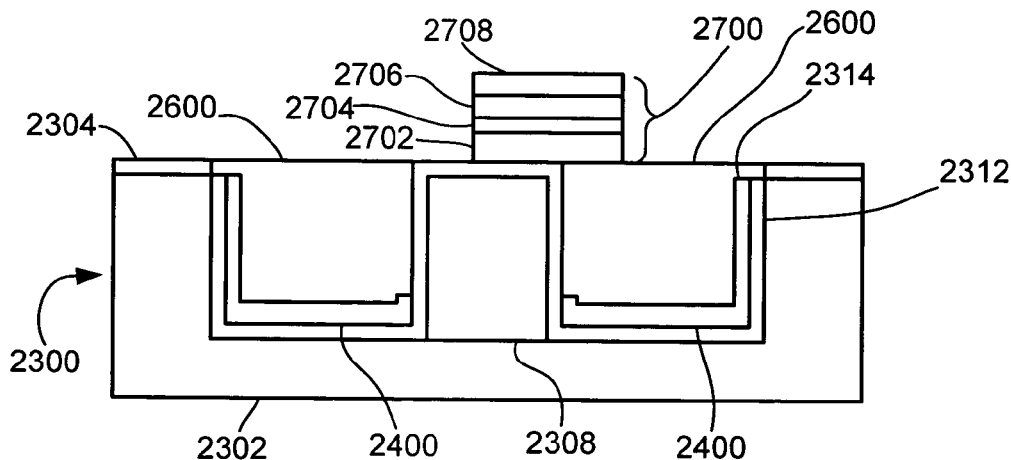
FIG. 27 is the structure of FIG. 26 after formation of a base stack.

Referring now to FIG. 27, therein is shown the structure of FIG. 26 after formation of a base stack 2700. The base stack 2700 includes an extrinsic base structure 2702. The extrinsic base structure 2702 is formed, for example, by depositing a layer of polysilicon that is implanted to form the extrinsic base structure 2702 that is a heavily doped polysilicon material of the first conductivity type, such as a p⁺ doped polysilicon.

A first silicide layer 2704, such as a tungsten silicide layer, is formed over the extrinsic base structure 2702, for example, by depositing a layer of silicide over the layer of polysilicon forming the extrinsic base structure 2702.

A first insulating structure 2706, such as an oxide structure, for example, a TEOS structure, is formed over the first silicide layer 2704, for example, by depositing an insulating layer over the silicide layer. A second insulating structure 2708, such as a nitride structure, is formed over the first insulating structure 2706, for example, by depositing an insulating material over the insulating layer forming the first insulating structure 2706.

The base stack 2700 is formed by depositing the various layers just described and processing them, for example, by exposing a base poly mask and then etching the various layers to form the base stack 2700. Thus, the base stack 2700 includes an extrinsic base structure 2702, a first silicide layer 2704 on top of the extrinsic base structure 2702, a first insulating structure 2706 on top of the first silicide layer 2704, and a second insulating structure 2708 over the first insulating structure 2706.

Figure 28:
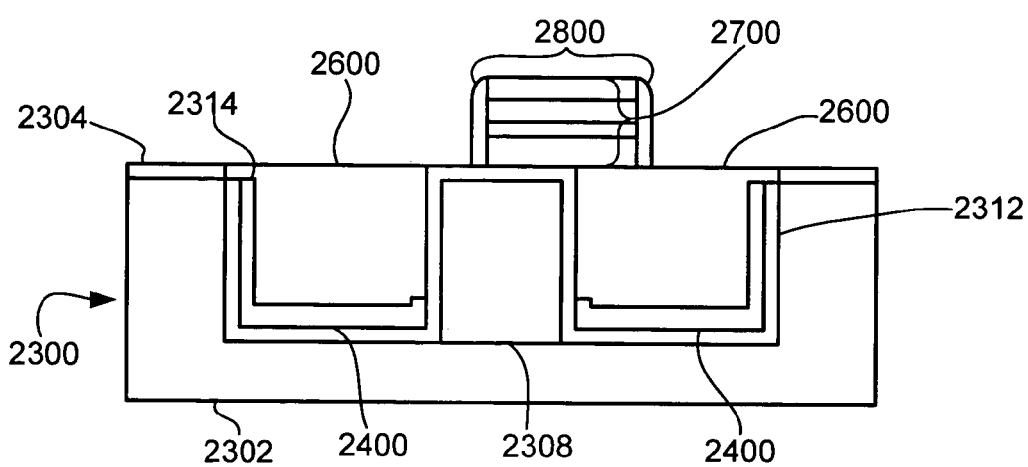
FIG. 28 is the structure of FIG. 27 after formation of an insulating spacer around the base stack.

Referring now to FIG. 28, therein is shown the structure of FIG. 27 after formation of an insulating spacer 2800, such as a nitride spacer, around the base stack. The insulating spacer 2800 is formed by depositing an insulating layer over the base stack 2700. The insulating layer is then processed to form the insulating spacer 2800 using conventional semiconductor manufacturing techniques.

Figure 29:
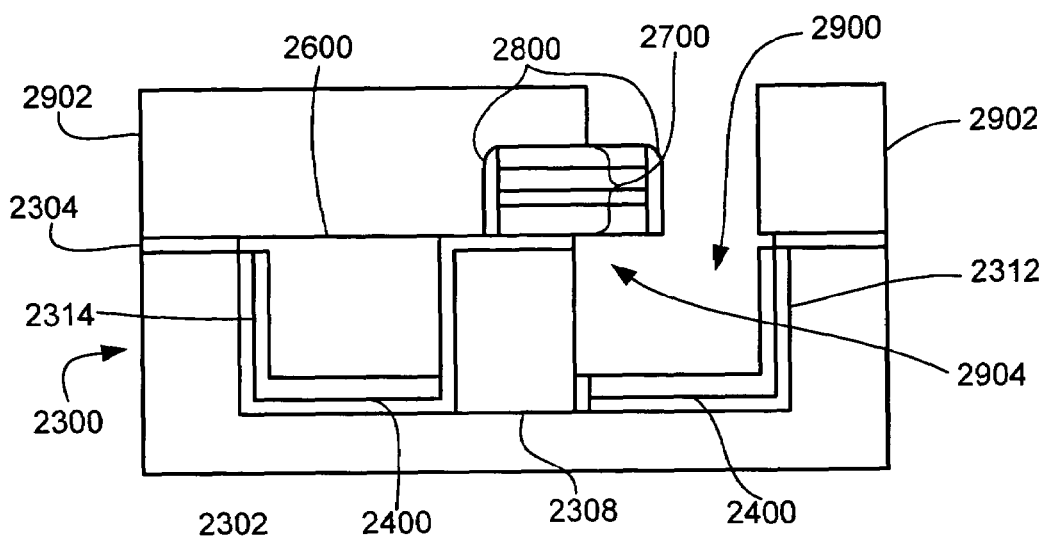
FIG. 29 is the structure of FIG. 28 after formation of an intrinsic base window.

Referring now to FIG. 29, therein is shown the structure of FIG. 28 after formation of an intrinsic base window 2900. The intrinsic base window 2900 is formed by providing a photoresist layer 2902. The photoresist layer 2902 is masked and processed to define a space over the intrinsic base window 2900. The insulating material 2600 in the intrinsic base window 2900 is then etched to stop on the fourth insulating layer 2314 and on the fifth insulating layer 2400 at the bottom of the intrinsic base window 2900. An anisotropic etch, such as a wet etch, for example, a HF/BOE is performed to etch the sidewall of the intrinsic base window 2900 to form an undercut region 2904 adjacent the intrinsic collector structure 2308. The undercut region 2904 extends beneath a portion of the base stack 2700.

Figure 30:
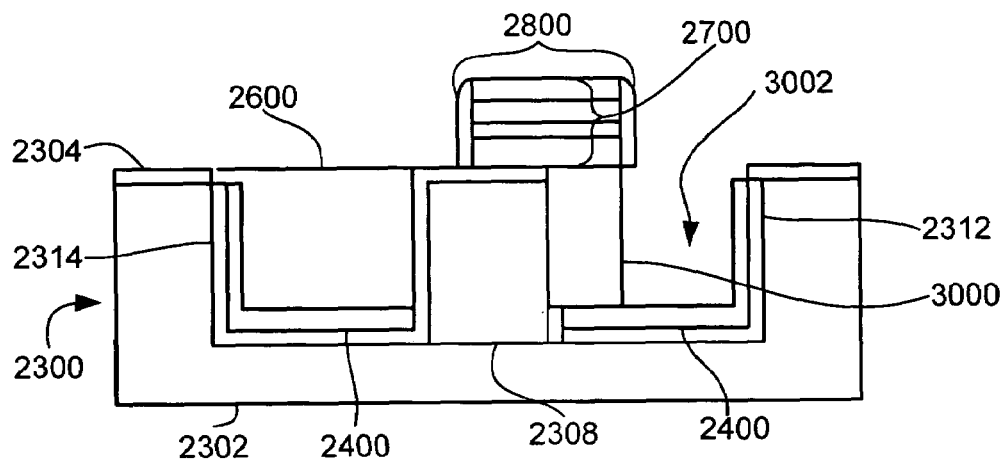
FIG. 30 is the structure of FIG. 29 after formation of an intrinsic base structure.

Referring now to FIG. 30, therein is shown the structure of FIG. 29 after formation of an intrinsic base structure 3000. The intrinsic base structure 3000 is formed by selectively forming a compound semiconductive material on the sidewall of the intrinsic collector structure 2308 in the undercut region 2904 shown in FIG. 29 of the intrinsic base window 2900. Preferably, the intrinsic base structure 3000 comprises at least one of silicon-germanium (Si/Ge), silicon-germanium-carbon (Si/Ge/C), and a combination thereof. The intrinsic base structure 3000 also preferably is doped in situ to form a lightly doped material of the first conductivity type, such as a $p^-$ doped compound semiconductive material. Formation of the intrinsic base structure 3000 partially fills the intrinsic base window 2900 to form an emitter window 3002.

Figure 31:
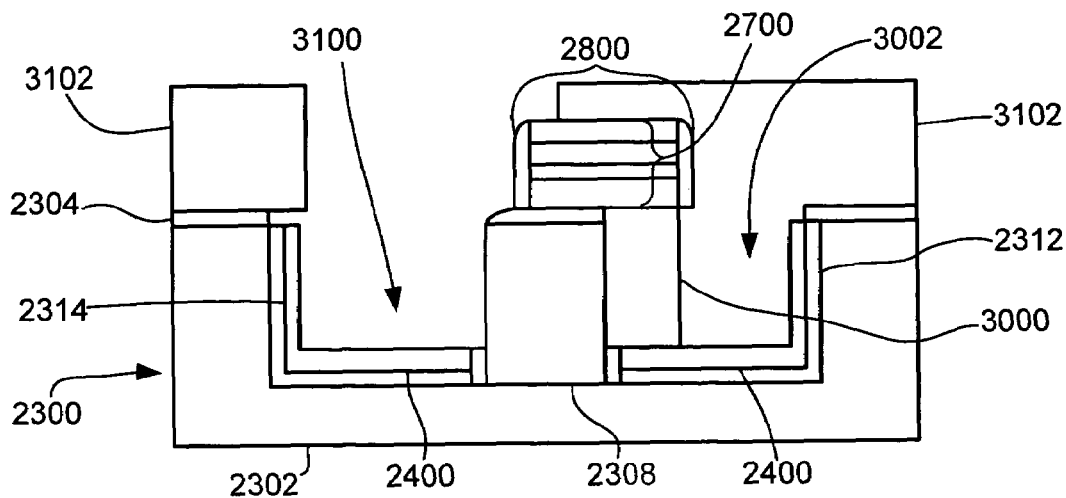
FIG. 31 is the structure of FIG. 30 after formation of an extrinsic collector window.

Referring now to FIG. 31, therein is shown the structure of FIG. 30 after formation of an extrinsic collector window 3100. The extrinsic collector window 3100 is formed by depositing a second photoresist layer 3102. The second photoresist layer 3102 is then masked and processed to form the extrinsic collector window 3100. The processing includes performing an anisotropic etch of the insulating material 2600 shown in FIG. 30 followed by a short isotropic etch, such as a HF/BOE dip, to expose the lateral side of the intrinsic collector structure 2308.

Figure 32:
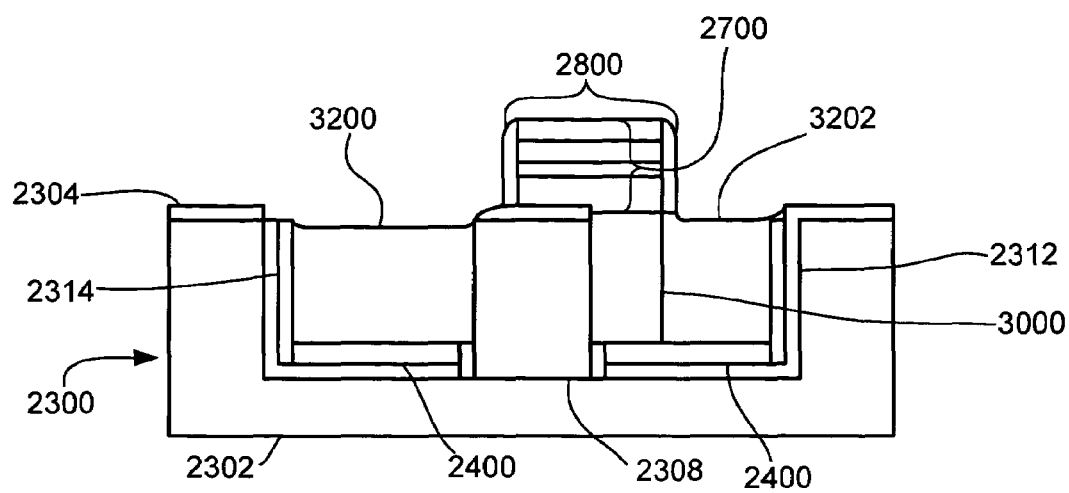
FIG. 32 is the structure of FIG. 31 after formation of an extrinsic collector structure and an emitter structure.

Referring now to FIG. 32, therein is shown the structure of FIG. 31 after formation of an extrinsic collector structure 3200 and an emitter structure 3202. The extrinsic collector structure 3200 and the emitter structure 3202 are formed by removing the second photoresist layer 3102 shown in FIG. 31. The extrinsic collector structure 3200, such as a heavily doped semiconductive material of the second conductivity type, is formed in the extrinsic collector window 3100 shown in FIG. 31. The emitter structure 3202 is formed in the emitter window 3002 shown in FIG. 30. The semiconductive material can be either selectively grown epitaxial silicon that is doped in situ, such as an $n^+$ epitaxial silicon, or deposited polysilicon that is doped in situ, such as an $n^+$ doped polysilicon. The semiconductive material is then etched back to recess it partially from the surface of the first insulating layer 2304. A RTA process may be performed if necessary to drive the dopant into the extrinsic collector structure 3200 and the emitter structure 3202 to obtain the desired dopant profile.

Figure 33:
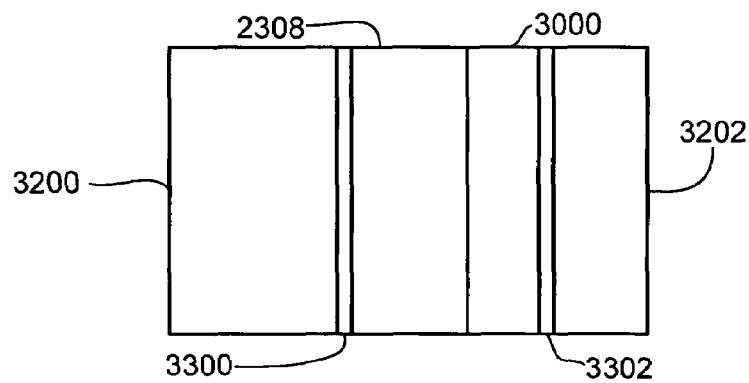
FIG. 33 is an enlarged cross-sectional view of the relative position of the collector structure, the intrinsic base structure, and the emitter structure of FIG. 32.

Referring now to FIG. 33, therein is shown an enlarged cross-sectional view 3300 of the relative position of the extrinsic collector structure 3200, the intrinsic collector structure 2308, the intrinsic base structure 3000, and the emitter structure 3202 of the structure of FIG. 32. The extrinsic collector structure 3200 has a first interface 3300 with the intrinsic collector structure 2308. Adjacent the opposite side of the intrinsic collector structure 2308 is the intrinsic base structure 3000. The intrinsic base structure 3000 has a second interface 3302 with the emitter structure 3202.

Figure 34:
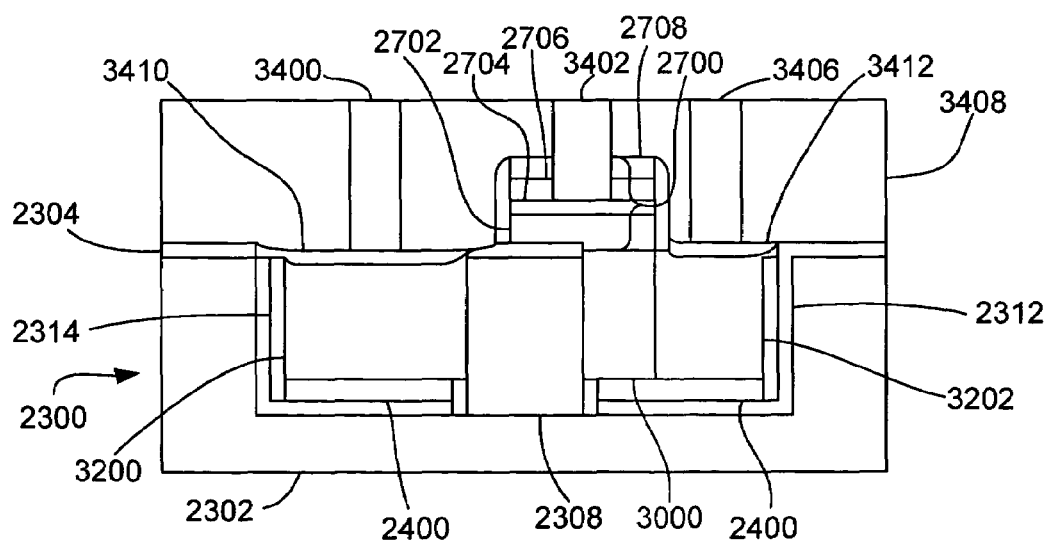
FIG. 34 is the structure of FIG. 32 after formation of a collector contact, a base contact, and an emitter contact in an interlevel dielectric layer.

Referring now to FIG. 34, therein is shown the structure of FIG. 32 after formation of a collector contact 3400, a base contact 3402, and an emitter contact 3406 through an ILD layer 3408. A second silicide layer 3410 is formed over the extrinsic collector structure 3200. A third silicide layer 3412 is formed over the emitter structure 3202.

The ILD layer 3408 is formed over the second silicide layer 3410, the third silicide layer 3412, and the base stack 2700. The collector contact 3400 is formed through the ILD layer 3408 in contact with the second silicide layer 3410 over the extrinsic collector structure 3200. The base contact 3402 is formed through the ILD layer 3408, through the second insulating structure 2708, and through the first insulating structure 2706 in contact with the first silicide layer 2704 over the extrinsic base structure 2702. The emitter contact 3410 is formed through the ILD layer 3408 in contact with the third silicide layer 3412 over the emitter structure 3202.

Figure 35:
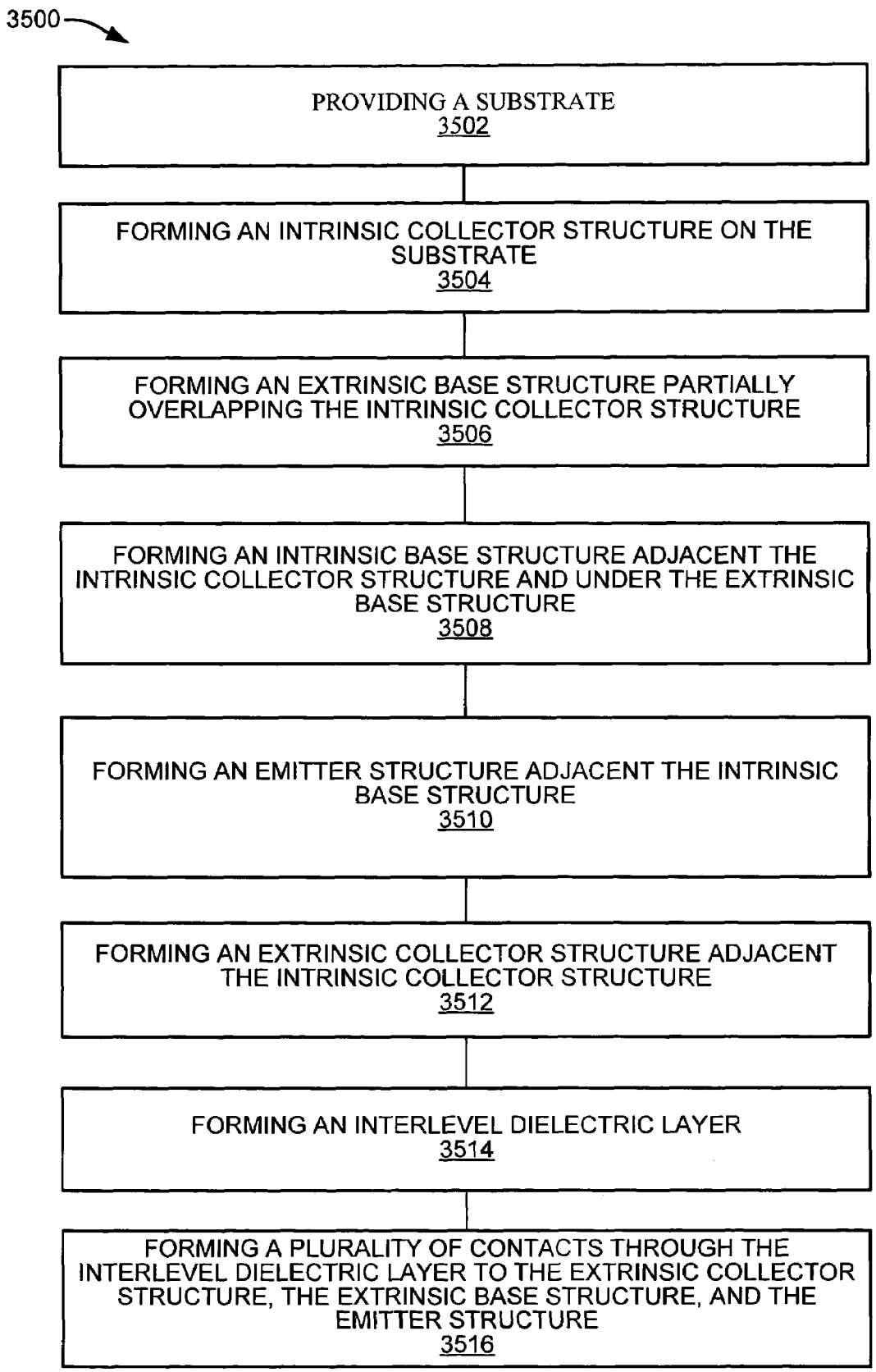
FIG. 35 is a flow chart of a method of manufacturing a lateral heterojunction bipolar transistor in accordance with the present invention.

Referring now to FIG. 35, therein is shown a flow chart of a method 3500 of manufacturing a HBT in accordance with the present invention. The method 3500 includes a step 3502 of providing a substrate; a step 3504 of forming an intrinsic collector structure on the substrate; a step 3506 of forming an extrinsic base structure partially overlapping the intrinsic collector structure; a step 3508 of forming an intrinsic base structure adjacent the intrinsic collector structure and under the extrinsic base structure; a step 3510 of forming an emitter structure adjacent the intrinsic base structure; a step 3512 of forming an extrinsic collector structure adjacent the intrinsic collector structure; a step 3514 of forming an interlevel dielectric layer; and a step 3516 of forming a plurality of contacts through the interlevel dielectric layer to the extrinsic collector structure, the extrinsic base structure, and the emitter structure.

Thus, it has been discovered that the method and apparatus of the present invention furnish important and heretofore unavailable solutions, capabilities, and functional advantages for manufacturing heterojunction bipolar transistors. The resulting process and configurations are straightforward, economical, uncomplicated, highly versatile, and effective, use conventional technologies, and are thus readily suited for manufacturing devices fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the spirit and scope of the included claims. All matters hither-to-fore set forth herein or shown in the accompanying drawings are to be interpreted in an illustrative and non-limiting sense.

What is claimed is:

1. A method for manufacturing a heterojunction bipolar transistor comprising:
   providing a substrate;
   forming an intrinsic collector structure on the substrate;
   forming an extrinsic base stack partially overlapping the intrinsic collector structure;
   forming a recess under the extrinsic base stack adjacent one side of the intrinsic collector structure;
   forming an intrinsic base structure adjacent the intrinsic collector structure and under the extrinsic base stack in the recess;
   forming an emitter structure adjacent the intrinsic base structure;
   forming an extrinsic collector structure adjacent the intrinsic collector structure apart from the intrinsic base structure;
   forming an interlevel dielectric layer; and
   forming a plurality of contacts through the interlevel dielectric layer to the extrinsic collector structure, the extrinsic base structure, and the emitter structure.

2. The method of manufacturing a heterojunction bipolar transistor as claimed in claim 1 wherein forming the intrinsic base structure selectively grows a compound semiconductive material adjacent the intrinsic collector structure in the recess.

3. The method of manufacturing a heterojunction bipolar transistor as claimed in claim 1 wherein:
   forming an extrinsic base structure surrounds the emitter structure with the extrinsic base structure; and
   forming the collector structure surrounds the extrinsic base structure with the collector structure.

4. The method of manufacturing a heterojunction bipolar transistor as claimed in claim 1 wherein forming the emitter structure, the extrinsic base structure, and the collector structure forms at least one of substantially concentric circles, substantially concentric ovals, substantially concentric rectangles, substantially concentric squares, and combinations thereof.

5. The method of manufacturing a heterojunction bipolar transistor as claimed in claim 1 wherein;
   forming the emitter structure forms an emitter structure substantially covering and parallel to the intrinsic base structure; and
   forming the collector structure forms a collector structure that is substantially perpendicular to the emitter structure.

6. The method of manufacturing a heterojunction bipolar transistor as claimed in claim 1 wherein forming the intrinsic base structure forms a structure comprising at least one of silicon-germanium, silicon-germanium-carbon, and a combination thereof.

7. The method of manufacturing a heterojunction bipolar transistor as claimed in claim 1 wherein forming the extrinsic base stack over the intrinsic collector structure further comprises:
   forming an emitter structure in the extrinsic base stack.

8. The method of manufacturing a heterojunction bipolar transistor as claimed in claim 1 wherein forming the intrinsic collector structure comprises:
   forming a first trench in the substrate; and
   forming a second trench in the substrate spaced from the first trench to form the intrinsic collector structure between the first trench and the second trench.

9. A method of manufacturing a heterojunction bipolar transistor comprising:
   providing a substrate;
   forming a collector structure on the substrate;
   forming a base stack comprising an extrinsic base structure and an extrinsic emitter structure over the collector structure;
   forming a recess into the collector structure adjacent the base stack:
   forming an intrinsic base structure in contact with the extrinsic base structure and adjacent the collector structure in the recess;
   forming an intrinsic emitter structure in contact with the extrinsic emitter structure and adjacent the intrinsic base structure;
   forming an interlevel dielectric layer; and
   forming a plurality of contacts through the interlevel dielectric layer in contact with the collector structure, the extrinsic base structure, and the extrinsic emitter structure.

10. The method of manufacturing a heterojunction bipolar transistor as claimed in claim 9 wherein forming the base stack comprises:
    forming a first insulating layer over the collector structure;
    forming an extrinsic base structure over the first insulating layer;
    forming a second insulating layer over the extrinsic base structure;
    forming an extrinsic emitter structure over the second insulating layer; and
    forming a third insulating layer over the extrinsic emitter structure.

11. The method of manufacturing a heterojunction bipolar transistor as claimed in claim 9 wherein:
    forming an extrinsic base structure surrounds the emitter structure with the extrinsic base structure; and
    forming the collector structure surrounds the extrinsic base structure with the collector structure.

12. The method of manufacturing a heterojunction bipolar transistor as claimed in claim 9 wherein forming the emitter structure, the extrinsic base structure, and the collector structure forms at least one of substantially concentric circles, substantially concentric ovals, substantially concentric rectangles, substantially concentric squares, and combinations thereof.

13. The method of manufacturing a heterojunction bipolar transistor as claimed in claim 9 wherein;
    forming the emitter structure forms an emitter structure substantially covering and parallel to the intrinsic base structure; and
    forming the collector structure forms a collector structure that is substantially perpendicular to the emitter structure.

14. The method of manufacturing a heterojunction bipolar transistor as claimed in claim 9 wherein forming the intrinsic base structure comprises:
    forming a recess beneath the base stack; and
    growing a compound semiconductive material in the recess.

15. The method of manufacturing a heterojunction bipolar transistor as claimed in claim 9 wherein forming the intrinsic base structure forms a structure of at least one of silicon-germanium, silicon-germanium-carbon, and a combination thereof.

16. The method of manufacturing a heterojunction bipolar transistor as claimed in claim 9 wherein;

forming the base stack forms an extrinsic base structure in contact with the intrinsic base structure;

forming the extrinsic collector structure forms a semiconductive material adjacent the intrinsic collector structure; and forming the intrinsic emitter structure forms a semiconductive material adjacent the intrinsic base structure.

17. A heterojunction bipolar transistor comprising:
a substrate;
an intrinsic collector structure having a recess on the substrate;
an extrinsic base stack partially overlapping the recess in the intrinsic collector structure;
an intrinsic base structure in the recess adjacent the intrinsic collector structure and under the extrinsic base structure;
an emitter structure adjacent the intrinsic base structure;
an extrinsic collector structure adjacent the intrinsic collector structure;
an interlevel dielectric layer; and
a plurality of contacts through the interlevel dielectric layer to the extrinsic collector structure, the extrinsic base structure, and the emitter structure.

18. The heterojunction bipolar transistor as claimed in claim 17 wherein the intrinsic base structure is a structure comprising at least one of silicon-germanium, silicon-germanium-carbon, and a combination thereof.

19. The heterojunction bipolar transistor as claimed in claim 17 wherein:
the emitter structure is surrounded by the extrinsic base structure; and
the collector structure surrounds the extrinsic base structure.

20. The heterojunction bipolar transistor as claimed in claim 17 wherein the emitter structure, the extrinsic base structure, and the collector structure form at least one of substantially concentric circles, substantially concentric ovals, substantially concentric rectangles, substantially concentric squares, and combinations thereof.

21. The heterojunction bipolar transistor as claimed in claim 17 wherein;
the emitter structure substantially covers and is parallel to the intrinsic base structure; and
the collector structure is substantially perpendicular to the emitter structure.

22. The heterojunction bipolar transistor as claimed in claim 17 wherein the intrinsic base structure is adjacent the intrinsic collector structure.

23. The heterojunction bipolar transistor as claimed in claim 17 wherein the extrinsic base structure is in a base stack further comprising:
an extrinsic emitter structure.

24. The heterojunction bipolar transistor as claimed in claim 17 wherein the intrinsic collector structure comprises:
a first trench in the substrate; and
a second trench in the substrate spaced from the first trench to form the intrinsic collector structure between the first trench and the second trench.

25. A heterojunction bipolar transistor comprising:
a substrate;
a collector structure having a recess on the substrate;
a base stack comprising an extrinsic base structure and an extrinsic emitter structure over the collector structure in the recess;
an intrinsic base structure adjacent the collector structure;
an intrinsic emitter structure adjacent the intrinsic base structure;
an interlevel dielectric layer; and
a plurality of contacts through the interlevel dielectric layer in contact with the collector structure, the extrinsic base structure, and the extrinsic emitter structure.

26. The heterojunction bipolar transistor as claimed in claim 25 wherein:
the emitter structure is surrounded by the extrinsic base structure; and
the collector structure surrounds the extrinsic base structure.

27. The heterojunction bipolar transistor as claimed in claim 25 wherein the emitter structure, the extrinsic base structure, and the collector structure form at least one of substantially concentric circles, substantially concentric ovals, substantially concentric rectangles, substantially concentric squares, and combinations thereof.

28. The heterojunction bipolar transistor as claimed in claim 25 wherein;
the emitter structure substantially covers and is parallel to the intrinsic base structure; and
the collector structure is substantially perpendicular to the emitter structure.

29. The heterojunction bipolar transistor as claimed in claim 25 wherein the base stack comprises:
a first insulating layer;
an extrinsic base structure on the first insulating layer;
a second insulating layer over the extrinsic base structure;
an extrinsic emitter structure over the second insulating layer: and
a third insulating layer over the extrinsic emitter structure.

30. The heterojunction bipolar transistor as claimed in claim 25 wherein;
the intrinsic base structure comprises a compound semiconductive material in the recess.

31. The heterojunction bipolar transistor as claimed in claim 25 wherein the intrinsic base structure comprises a structure of at least one of silicon-germanium, silicon-germanium-carbon, and a combination thereof.

32. The heterojunction bipolar transistor as claimed in claim 25 wherein;
the base stack comprises an extrinsic base structure in contact with the intrinsic base structure;
the extrinsic collector structure comprises a semiconductive material adjacent the intrinsic collector structure; and
the intrinsic emitter structure comprises a semiconductive material adjacent the intrinsic base structure.

* * * * *